US010319545B2

(12) United States Patent
Kamenšek et al.

(10) Patent No.: US 10,319,545 B2
(45) Date of Patent: Jun. 11, 2019

(54) SURGE PROTECTIVE DEVICE MODULES AND DIN RAIL DEVICE SYSTEMS INCLUDING SAME

(71) Applicant: Iskra Zaščite d.o.o., Ljubljana (SI)

(72) Inventors: Sebastjan Kamenšek, Škofja Loka (SI); Tadej Knez, Grosuplje (SI); Igor Juričev, Izola (SI); Milenko Vukotić, Ljubljana (SI); Thomas Tsovilis, Ljubljana (SI); Zafiris G. Politis, Athens (GR)

(73) Assignee: Iskra Zaščite d.o.o., Ljubljana (SI)

( * ) Notice: Subject to any disclaimer, the term of this patent is extended or adjusted under 35 U.S.C. 154(b) by 49 days.

(21) Appl. No.: 15/365,453

(22) Filed: Nov. 30, 2016

(65) Prior Publication Data

US 2018/0151318 A1 May 31, 2018

(51) Int. Cl.
*H05K 5/00* (2006.01)
*H05K 7/00* (2006.01)
(Continued)

(52) U.S. Cl.
CPC ............... *H01H 37/74* (2013.01); *H01C 1/01* (2013.01); *H01C 7/126* (2013.01); *H01H 37/04* (2013.01);
(Continued)

(58) Field of Classification Search
CPC ...................................................... H01H 83/10
See application file for complete search history.

(56) References Cited

U.S. PATENT DOCUMENTS 1,144,029 A 6/1915 Creighton
2,158,859 A 5/1939 Horikoshi
(Continued)

FOREIGN PATENT DOCUMENTS

CH 466 427 A 12/1968
DE 3428258 A1 2/1986
(Continued)

OTHER PUBLICATIONS

U.S. Appl. No. 15/134,676, Iskra Zascite d.o.o, filed Apr. 21, 2016,
(Continued)

*Primary Examiner* — Jerry Wu
(74) *Attorney, Agent, or Firm* — Myers Bigel, P.A.

(57) ABSTRACT

A surge protective device (SPD) module includes a module housing, first and second module electrical terminals mounted on the module housing, a gas discharge tube (GDT) mounted in the module housing, and a fail-safe mechanism mounted in the module housing. The GDT includes a first GDT terminal electrically connected to the first module electrical terminal and a second GDT terminal electrically connected to the second module electrical terminal. The fail-safe mechanism includes: an electrically conductive shorting bar positioned in a ready position and repositionable to a shorting position; a biasing member applying a biasing load to the shorting bar to direct the shorting bar from the ready position to the shorting position; and a meltable member. The meltable member maintains the shorting bar in the ready position and melts in response to a prescribed temperature to permit the shorting bar to transition from the ready position to the shorting position under the biasing load of the biasing member. In the shorting position, the shorting bar forms an electrical short circuit between the first and second GDT terminals to bypass the GDT.

14 Claims, 20 Drawing Sheets

(51) Int. Cl.

| | |
|---|---|
| ***H01H 37/74*** | (2006.01) |
| ***H01H 37/04*** | (2006.01) |
| ***H01H 37/08*** | (2006.01) |
| ***H01H 37/46*** | (2006.01) |
| ***H01H 79/00*** | (2006.01) |
| ***H01R 25/14*** | (2006.01) |
| ***H01C 1/01*** | (2006.01) |
| ***H01C 7/12*** | (2006.01) |
| ***H01H 85/44*** | (2006.01) |
| ***H01T 4/02*** | (2006.01) |
| ***H01T 4/08*** | (2006.01) |
| *H01R 9/26* | (2006.01) |
| *H01T 4/06* | (2006.01) |
| *H01H 37/76* | (2006.01) |

(52) U.S. Cl.

CPC ............ *H01H 37/08* (2013.01); *H01H 37/46* (2013.01); *H01H 79/00* (2013.01); *H01H 85/44* (2013.01); *H01R 25/14* (2013.01); *H01T 4/02* (2013.01); *H01T 4/08* (2013.01); *H01H 2037/762* (2013.01); *H01R 9/2641* (2013.01); *H01T 4/06* (2013.01)

(56) References Cited

U.S. PATENT DOCUMENTS

| | | | | |
|---|---|---|---|---|
| 2,311,758 | A | 2/1943 | Johansson | |
| 2,971,132 | A | 2/1961 | Nash | |
| 3,249,719 | A | 5/1966 | Misare et al. | |
| 3,522,570 | A | 8/1970 | Wanaselja | |
| 3,711,794 | A | 1/1973 | Tasca et al. | |
| 3,813,577 | A | 5/1974 | Kawiecke | |
| 4,015,228 | A | 3/1977 | Eda et al. | |
| 4,023,133 | A | 5/1977 | Knapp, Jr. | |
| 4,085,397 | A | 4/1978 | Yagher, Jr. | |
| 4,092,694 | A | 5/1978 | Stetson | |
| 4,240,124 | A | 12/1980 | Westrom | |
| 4,241,374 | A | 12/1980 | Gilberts | |
| 4,249,224 | A | 2/1981 | Baumbach | |
| 4,288,833 | A | 9/1981 | Howell | |
| 4,355,345 | A | 10/1982 | Franchet | |
| 4,425,017 | A | 1/1984 | Chan | |
| 4,493,003 | A | 1/1985 | Mickelson et al. | |
| 4,595,635 | A | 6/1986 | Dubrow et al. | |
| 4,600,261 | A | 7/1986 | Debbaut | |
| 4,638,284 | A | 1/1987 | Levinson | |
| 4,701,574 | A | 10/1987 | Shimirak et al. | |
| 4,906,963 | A | 3/1990 | Ackermann et al. | |
| 4,908,730 | A | 3/1990 | Westrom | |
| 4,956,696 | A | 9/1990 | Hoppe et al. | |
| 5,172,296 | A | 12/1992 | Kaczmarek | |
| 5,311,164 | A | 5/1994 | Ikeda et al. | |
| 5,519,564 | A | 5/1996 | Carpenter | |
| 5,523,916 | A | 6/1996 | Kaczmarek | |
| 5,529,508 | A | 6/1996 | Chiotis et al. | |
| 5,588,856 | A | 12/1996 | Collins et al. | |
| 5,652,690 | A | 7/1997 | Mansfield et al. | |
| 5,721,664 | A | 2/1998 | Uken et al. | |
| 5,781,394 | A | 7/1998 | Lorenz et al. | |
| 5,808,850 | A | 9/1998 | Carpenter, Jr. | |
| 5,936,824 | A | 8/1999 | Carpenter, Jr. | |
| 6,038,119 | A | 3/2000 | Atkins et al. | |
| 6,094,128 | A | 7/2000 | Bennett et al. | |
| 6,172,865 | B1 | 1/2001 | Boy et al. | |
| 6,175,480 | B1 | 1/2001 | Karmazyn | |
| 6,222,433 | B1 | 4/2001 | Ramakrishnan et al. | |
| 6,430,019 | B1 | 8/2002 | Martenson et al. | |
| 6,430,020 | B1 | 8/2002 | Atkins et al. | |
| 6,556,402 | B2 | 4/2003 | Kizis et al. | |
| 6,614,640 | B2 | 9/2003 | Richter et al. | |
| 7,433,169 | B2 | 10/2008 | Kamel et al. | |
| 7,558,041 | B2 | 7/2009 | Lagnoux | |
| 7,684,166 | B2 | 3/2010 | Donati et al. | |
| 7,738,231 | B2 | 6/2010 | Lagnoux | |
| 8,659,866 | B2 | 2/2014 | Douglass et al. | |
| 8,743,525 | B2 | 6/2014 | Xepapas et al. | |
| 9,634,554 | B2 | 4/2017 | Falk et al. | |
| 2002/0018331 | A1 | 2/2002 | Takahashi | |
| 2004/0150937 | A1 | 8/2004 | Bobert et al. | |
| 2005/0231872 | A1* | 10/2005 | Schimanski | H01T 1/12 361/91.1 |
| 2006/0291127 | A1 | 12/2006 | Kim et al. | |
| 2007/0217106 | A1 | 9/2007 | Lagnoux | |
| 2008/0043395 | A1 | 2/2008 | Donati et al. | |
| 2008/0049370 | A1 | 2/2008 | Adachi et al. | |
| 2011/0193674 | A1 | 8/2011 | Zäuner et al. | |
| 2011/0248816 | A1 | 10/2011 | Duval et al. | |
| 2012/0050935 | A1 | 3/2012 | Douglass et al. | |
| 2012/0086539 | A1 | 4/2012 | Duval et al. | |
| 2012/0086540 | A1 | 4/2012 | Duval et al. | |
| 2013/0038976 | A1 | 2/2013 | Hagerty | |
| 2013/0200986 | A1 | 8/2013 | Koprivsek | |
| 2013/0265685 | A1 | 10/2013 | Zäuner et al. | |
| 2013/0335869 | A1 | 12/2013 | Xepapas et al. | |
| 2014/0010704 | A1 | 1/2014 | Ishida et al. | |
| 2014/0327990 | A1 | 11/2014 | Juricev | |
| 2015/0107972 | A1 | 4/2015 | Oh | |
| 2015/0270086 | A1 | 9/2015 | Chen | |
| 2015/0280420 | A1 | 10/2015 | Mao | |
| 2015/0349523 | A1 | 12/2015 | Tsovilis et al. | |
| 2016/0087520 | A1 | 3/2016 | Falk et al. | |
| 2016/0276821 | A1 | 9/2016 | Politis et al. | |

FOREIGN PATENT DOCUMENTS

| | | | |
|---|---|---|---|
| DE | 4235329 | A1 | 4/1994 |
| DE | 4438593 | A1 | 5/1996 |
| DE | 19823446 | A1 | 11/1999 |
| DE | 19839422 | A1 | 3/2000 |
| DE | 19843519 | | 4/2000 |
| DE | 20 2004 006 227 | | 10/2004 |
| DE | 10323220 | A1 | 12/2004 |
| DE | 10 2006 003 274 | A1 | 1/2008 |
| DE | 20 2008 004 699 | U1 | 6/2008 |
| DE | 10 2007 014 336 | | 10/2008 |
| DE | 10 2008 017 423 | A1 | 10/2009 |
| DE | 10 2013 021 936 | B3 | 2/2012 |
| DE | 20 2006 021 210 | U1 | 9/2013 |
| DE | 10 2013 103 753 | A1 | 10/2013 |
| DE | 10 2013 011 216 | | 10/2014 |
| DE | 10 2013 107 807 | | 1/2015 |
| EP | 0108518 | | 5/1984 |
| EP | 0203737 | | 12/1986 |
| EP | 0335479 | | 10/1989 |
| EP | 0445054 | | 9/1991 |
| EP | 0516416 | A1 | 12/1992 |
| EP | 0603428 | A | 6/1994 |
| EP | 0785625 | A2 | 7/1997 |
| EP | 0963590 | | 12/1999 |
| EP | 1094550 | | 4/2001 |
| EP | 1116246 | A1 | 7/2001 |
| EP | 1355327 | A2 | 10/2003 |
| EP | 1458072 | A1 | 9/2004 |
| EP | 1798742 | A1 | 6/2007 |
| EP | 2075811 | | 7/2009 |
| EP | 3001525 | A1 | 3/2016 |
| EP | 3240132 | | 11/2017 |
| FR | 2 574 589 | A1 | 6/1986 |
| FR | 2 622 047 | A1 | 4/1989 |
| FR | 2897231 | | 8/2007 |
| JP | 60-187002 | | 9/1985 |
| JP | 60-226103 | | 11/1985 |
| JP | 60-258905 | | 12/1985 |
| JP | 61-198701 | | 9/1986 |
| JP | 1-176687 | | 7/1989 |
| JP | H 05176445 | A | 7/1993 |
| JP | 09-326546 | | 12/1997 |
| JP | 2002-525861 | | 8/2002 |
| JP | 2002-525862 | | 8/2002 |
| SI | 9700277 | A | 4/1999 |
| SI | 9700332 | A | 6/1999 |
| SI | 20781 | A | 6/2002 |

(56) References Cited

FOREIGN PATENT DOCUMENTS

| | | | |
|---|---|---|---|
| SI | 20782 | A | 6/2002 |
| SI | 22030 | A | 10/2006 |
| SI | 24371 | A | 11/2014 |
| WO | WO 88/00603 | | 1/1988 |
| WO | WO 90/05401 | | 5/1990 |
| WO | WO 95/15600 | | 6/1995 |
| WO | WO 95/24756 | | 9/1995 |
| WO | WO 97/42693 | | 11/1997 |
| WO | WO 98/38653 | | 9/1998 |
| WO | WO 00/17892 | | 3/2000 |
| WO | WO 2007/0117163 | A1 | 10/2007 |
| WO | WO 2008/009507 | A1 | 1/2008 |
| WO | 2008/104824 | | 9/2008 |
| WO | WO 2012/026888 | A1 | 3/2012 |
| WO | WO 2013/044961 | A1 | 4/2013 |
| WO | 2016/101776 | | 6/2016 |
| WO | WO 2016/110360 | A1 | 7/2016 |

OTHER PUBLICATIONS

Beitz et al. "Dubbel Taschenbuch fër den Maschinenbau" (3 pages) (1997).

Data Book Library 1997 Passive Components, Siemens Matsushita Components pp. 15-17, 26-32, 36-37, 39, 161, 166, 167, 169, 171-174 (1997).

Extended European Search Report in corresponding European Application No. 12177955.7 (7 pages) (Feb. 27, 2013).

Notification of Transmittal of the International Search Report and Written Opinion of the International Searching Authority issued in corresponding PCT Application No. PCT/GR2013/000030 (12 pages) (Jul. 23, 2013).

Oberg et al. "Machinery's Handbook 27$^{th}$ Edition—Soldering and Brazing" (4 pages) (2004).

Raycap "Rayvoss™ Transient Voltage Surge Suppression System" webpage <http://www.raycap.com/surge/rayvoss.htm> accessed on Nov. 29, 2005 (1 page) (Date Unknown; Admitted Prior Art).

Raycap "Revolutionary Lightning Protection Technology" Raycap Corporation Press Release, webpage <http://www.raycap.com/news/020930.htm> accessed on Nov. 29, 2005 (1 p.) (Date Unknown; Admitted Prior Art).

Raycap "The Ultimate Overvoltage Protection: Rayvoss™" brochure (4 pages) (Date Unknown; Admitted Prior Art).

Rayvoss™ "The Ultimate Overvoltage Protection" webpage <http://www.rayvoss.com> accessed on Nov. 29, 2005 (2 pages) (Date Unknown; Admitted Prior Art).

Rayvoss™ "Applications" webpage <http://www.rayvoss.com/applications.htm> accessed on Nov. 29, 2005 (4 pages) (undated).

Rayvoss™ "Frequently Asked Questions" webpage <http://www.rayvoss.com/faq.htm> accessed on Nov. 29, 2005 (2 pages) (Date Unknown; Admitted Prior Art).

Rayvoss™ "Technical Information" webpage <http://www.rayvoss.com/tech_info.htm> accessed on Nov. 29, 2005 (3 pages) (Date Unknown; Admitted Prior Art).

Raycap "The Next Generation Surge Protection Rayvoss™" brochure (4 pages) (May 4, 2012).

Raycap "The Ultimate Overvoltage Protection Rayvoss™" brochure (4 pages) (2005).

Raycap "The Ultimate Overvoltage Protection Rayvoss™" brochure (4 pages) (Jan. 2009).

Raycap "Strikesorb® 30 Series OEM Surge Suppression Solutions" brochure (2 pages) (Apr. 17, 2009).

Extended European Search Report corresponding to European Application No. 17190722.3 (10 pages) (dated May 9, 2018).

* cited by examiner

SURGE PROTECTIVE DEVICE MODULES AND DIN RAIL DEVICE SYSTEMS INCLUDING SAME

FIELD OF THE INVENTION

The present invention relates to surge protective devices and, more particularly, to connector systems, fail-safe mechanisms, and alerting mechanisms for surge protective device modules.

BACKGROUND OF THE INVENTION

Frequently, excessive voltage or current is applied across service lines that deliver power to residences and commercial and institutional facilities. Such excess voltage or current spikes (transient overvoltages and surge currents) may result from lightning strikes, for example. The above events may be of particular concern in telecommunications distribution centers, hospitals and other facilities where equipment damage caused by overvoltages and/or current surges and resulting down time may be very costly. Typically, sensitive electronic equipment may be protected against transient overvoltages and surge currents using surge protective devices (SPDs).

Overvoltage protection devices, circuit breakers, fuses, ground connections and the like are often mounted on DIN (Deutsches Institut für Normung e.V.) rails. DIN rails may serve as mounting brackets of standardized dimensions so that such electrical control devices may be sized and configured to be readily and securely mounted to a support surface such as an electrical service utility box.

SUMMARY

According to embodiments of the invention, a surge protective device (SPD) module includes a module housing, first and second module electrical terminals mounted on the module housing, a gas discharge tube (GDT) mounted in the module housing, and a fail-safe mechanism mounted in the module housing. The GDT includes a first GDT terminal electrically connected to the first module electrical terminal and a second GDT terminal electrically connected to the second module electrical terminal. The fail-safe mechanism includes: an electrically conductive shorting bar positioned in a ready position and repositionable to a shorting position; a biasing member applying a biasing load to the shorting bar to direct the shorting bar from the ready position to the shorting position; and a meltable member. The meltable member maintains the shorting bar in the ready position and melts in response to a prescribed temperature to permit the shorting bar to transition from the ready position to the shorting position under the biasing load of the biasing member. In the shorting position, the shorting bar forms an electrical short circuit between the first and second GDT terminals to bypass the GDT.

In some embodiments, the SPD module includes: a first carrier contact member including a first shorting portion electrically connected to the first GDT terminal; and a second carrier contact member including a second shorting portion electrically connected to the second GDT terminal. In the ready position, the meltable member holds the shorting bar spaced apart from and electrically isolated from the first and second shorting portions. When the meltable member melts, the biasing member forcibly displaces the shorting bar into contact with each of the first and second shorting portions to form the electrical short circuit between the first and second GDT terminals to bypass the GDT.

In some embodiments, the first carrier contact member includes a first GDT mount hole, the second carrier contact member includes a second GDT mount hole. The first GDT terminal is seated in the first GDT mount hole and secured therein by solder in the first GDT mount hole. The second GDT terminal is seated in the second GDT mount hole and secured therein by solder in the second GDT mount hole.

In some embodiments, the meltable member is formed of metal.

In some embodiments, the meltable member has a melting point in the range of from about 90° C. to 240° C.

According to some embodiments, the SPD module includes an alarm mechanism responsive to melting of the meltable member to provide an alert that the SPD module has failed.

In some embodiments, the alarm mechanism includes a local alarm mechanism including: a window defined in the module housing; an indicator member movable between first and second positions relative to the window; an indicator biasing member applying a biasing load to the indicator member to direct the indicator member from the first position to the second position; and a trigger member. The trigger member retains the indicator member in the first position. When the meltable member melts, the trigger member releases the indicator member to move from the first position to the second position under the biasing load of the indicator biasing member.

In some embodiments, the alarm mechanism includes a remote alarm mechanism including: a port defined in the module housing to receive a remote control pin; and an indicator member having an indicator hole defined therein. The indicator member is movable between a first position, wherein the indicator member covers the port, and a second position, wherein the indicator opening is aligned with the port and permits the remote control pin to extend through the indicator opening. When the meltable member melts, the indicator member is moved from the first position to the second position under the biasing load of the biasing member.

According to some embodiments, the first and second module terminals are bullet connectors.

In some embodiments, the SPD module includes: a first carrier contact member electrically connecting the first GOT terminal to the first module terminal; and a second carrier contact member electrically connecting the second GDT terminal to the second module terminal. The first module terminal is orbitally riveted to the first carrier contact member. The second module terminal is orbitally riveted to the second carrier contact member.

According to embodiments of the invention, a DIN rail surge protective device (SPD) system includes a base, an SPD module and an electrical connector system to selectively electrically connect the SPD module to the base. The base is configured to be mounted on a DIN rail. The base defines a receiver slot. The SPD module is configured to be removably mounted in the receiver slot to form with the base a DIN rail SPD assembly. The electrical connector system includes: a socket connector affixed on one of the base and the SPD module, the socket connector defining a socket; and a bullet connector on the other of the base and the SPD module. The bullet connector includes a post body configured to be received in the socket to electrically and mechanically connect the SPD module to the base.

In some embodiments, the socket and the post body are substantially cylindrical.

In some embodiments, the socket connector includes a plurality of circumferentially distributed, radially deflectable, electrically conductive contact fingers. The contact fingers define the socket.

In some embodiments, the socket connector includes slots between the contact fingers to permit the contact fingers to deflect independently of one another.

In some embodiments, the socket connector is orbitally riveted to an electrically conductive terminal support.

According to some embodiments, the bullet connector is orbitally riveted to an electrically conductive terminal support.

According to some embodiments, the socket connector forms a part of the base.

In some embodiments, the bullet connector forms a part of the SPD module.

According to some embodiments, the base includes a base terminal connector assembly including: the socket connector; a connector body, wherein the socket connector is mounted on the connector body; and a cable clamp connector electrically and mechanically joined to the socket connector by the connector body.

In some embodiments, the cable clamp connector includes: a cable termination portion of the connector body; a cage member; and a threaded member operable to displace the cage member relative to the cable termination portion to clamp a cable therebetween.

According to some embodiments, the cable termination portion is monolithic and forms a loop defining a cavity.

In some embodiments, the cable termination portion includes: first and second walls; a key slot defined in the first wall; and an integral key tab. The key tab extends from the second wall and is interlocked with the key slot to inhibit or prevent the first and second walls from separating.

According to some embodiments, the cage member is monolithic, forms a loop defining a cavity, and surrounds a portion of the cable termination portion.

In some embodiments, the cage member includes: first and second walls; a key slot defined in the first wall; and an integral key tab. The key tab extends from the second wall and is interlocked with the key slot to inhibit or prevent the first and second walls from separating.

According to some embodiments, the cage member includes an inner front wall, an outer front wall overlying the inner front wall, a hole defined in the outer front wall, and an integral, threaded flange on the inner front wall. The flange extends into the hole and is threadedly mated with the threaded member.

According to some embodiments, the connector body includes: a cable termination portion; a socket connector mount portion on which the socket connector is mounted; and a bridge portion connecting the cable termination portion to the socket connector mount portion. The connector body is monolithic. The bridge portion has an arcuate cross-sectional profile with an arc radius in the range of from about 5 mm to 6 mm.

According to embodiments of the invention, a surge protective device (SPD) module includes a module housing, first and second module electrical terminals mounted on the module housing, a gas discharge tube (GDT) mounted in the module housing, a trigger member, a trigger biasing member, a meltable member, and a local alarm mechanism. The GDT includes a first GDT terminal electrically connected to the first module electrical terminal and a second GDT terminal electrically connected to the second module electrical terminal. The meltable member is meltable in response to a prescribed temperature. The local alarm mechanism includes: a window defined in the module housing; an indicator member movable between first and second positions relative to the window; and an indicator biasing member applying a biasing load to the indicator member to direct the indicator member from the first position to the second position. The meltable member retains the trigger member in a lock position, wherein the trigger member retains the indicator member in the first position. When the meltable member melts, the trigger biasing member forces the trigger member from the lock position to a release position, wherein the trigger member releases the indicator member to move from the first position to the second position under the biasing load of the indicator biasing member.

In some embodiments, the SPD module further includes a remote alarm mechanism including: a port defined in the module housing to receive a remote control pin; and an indicator member having an indicator hole defined therein. The indicator member is movable between a first position, wherein the indicator member covers the port, and a second position, wherein the indicator opening is aligned with the port and permits the remote control pin to extend through the indicator opening. When the meltable member melts, the indicator member is moved from the first position to the second position under the biasing load of the biasing member.

Further features, advantages and details of the present invention will be appreciated by those of ordinary skill in the art from a reading of the figures and the detailed description of the preferred embodiments that follow, such description being merely illustrative of the present invention.

BRIEF DESCRIPTION OF THE DRAWINGS

The accompanying drawings, which form a part of the specification, illustrate embodiments of the present invention.

DETAILED DESCRIPTION OF EMBODIMENTS OF THE INVENTION

Figure 1:
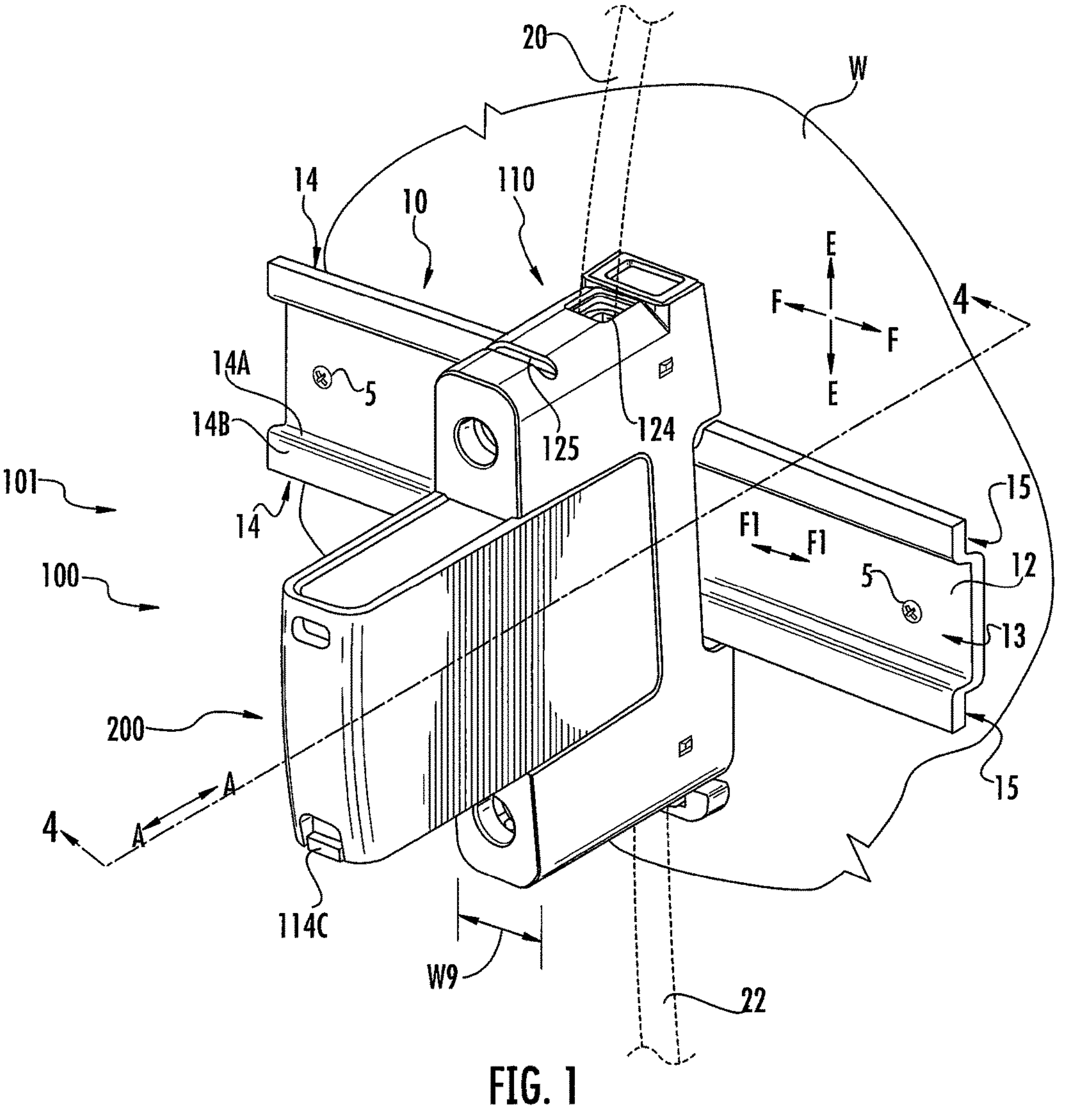
FIG. 1 is a top, front perspective view of a DIN rail device system and a DIN rail device assembly according to embodiments of the invention.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "monolithic" means an object that is a single, unitary piece formed or composed of a material without joints or seams.

With reference to FIGS. 1-20, a DIN rail surge protective device (SPD) system 101 according to embodiments of the present invention and a DIN rail device mount assembly 100 formed therefrom are shown therein. According to some embodiments and as shown, the assembly 100 is configured, sized and shaped for mounting on a support rail 10 (e.g., DIN rail 10 shown in FIG. 1) and is compliant with corresponding applicable DIN requirements or standards. The DIN rail 10 may be secured (e.g., by screws 5 or other fasteners) to a suitable support structure such as a wall W, for example, a rear wall of an electrical service utility cabinet.

As discussed in more detail below, the system 101 includes a pedestal or base 110 that is removably mountable on the DIN rail 10 and a pluggable surge protective device (SPD) module 200 that is in turn removably mountable on the base 110. The module 200 includes a gas discharge tube (GDT) circuit, a fail-safe mechanism 201, a local alarm mechanism 203, and a remote alarm mechanism 205, as discussed in more detail below. The system 101 also includes an electrical connector system 103, as discussed in more detail below, for selectively electrically connecting the module 200 to the base 110.

In some embodiments, the maximum dimensions of the assembly 100 are compliant with at least one of the following DIN Standards: DIN 43 880 (December 1988). In some embodiments, the maximum dimensions of the assembly 100 are compliant with each of these standards.

According to some embodiments and as shown, the rail 10 is a DIN rail. That is, the rail 10 is a rail sized and configured to meet DIN specifications for rails for mounting modular electrical equipment.

The DIN rail 10 has a rear wall 12 and integral, lengthwise flanges 14 extending outwardly from the rear wall 12. Each flange 14 includes a forwardly extending wall 14A and an outwardly extending wall 14B. The walls 12, 14 together form a lengthwise extending front, central channel 13 and opposed, lengthwise extending, rear, edge channels 15. Mounting holes 16 may be provided extending fully through the wall 12 and to receive fasteners (e.g., threaded fasteners or rivets) for securing the rail 10 to a support structure (e.g., a wall or panel). The DIN rail 10 defines a DIN rail plane E-F and has a lengthwise axis F1-F1 extending in the plane E-F. DIN rails of this type may be referred to as "top hat" support rails.

According to some embodiments, the rail 10 is a 35 mm (width) DIN rail. According to some embodiments, the rail 10 is formed of metal and/or a composite or plastic material.

The assembly 100 has a DIN rail device assembly axis A-A (FIG. 1) that extends transversely to and, in some embodiments, substantially perpendicular to the axis F1-F1 of the DIN rail 10. In some embodiments, the DIN rail mount assembly axis A-A extends transversely to and, in some embodiments, substantially orthogonal to the plane E-F of the DIN rail 10. As used herein, "front" or "distal" refers to the end farther away from the DIN rail 10 when the assembly 100 is mounted on the DIN rail 10, and "rear" or "proximal" refers to the end nearer the DIN rail 10.

The base 110 includes a rear housing member 114A and a front housing member 114B collectively forming a housing 112. The housing 112 includes a rear section 112A, an upper leg or section 112B, and a lower leg or section 112C. The housing 112 defines an enclosed internal cavity 115. According to some embodiments, the housing members 114A, 114B are formed of an electrically insulating polymeric material.

A J-shaped clip or lock member 114C is coupled to the base 110 by a hinge. The lock member 114C can be selectively interlocked with a cooperating latch feature on the front end of the module 200 to lock the module 200 into the base 110.

The housing members 114A, 114B and the lock member 114C may be formed of any suitable material or materials. In some embodiments, each of the housing members 114A, 114B and the lock member 114C are formed of a rigid polymeric material or metal (e.g., aluminum). Suitable polymeric materials may include polyamide (PA), polypropylene (PP), polyphenylene sulfide (PPS), or ABS, for example.

A DIN rail receiver channel 117 is defined in the rear side of the rear section 112A. Integral rail hook features 118A are located on one side of the channel 117 and a spring loaded DIN rail latch mechanism 118B is mounted on the other side of the channel 117. The features and components 117, 118A, 118B are sized and configured to securely and releasably mount the base 110 on a standard DIN rail 10 as is known in the art.

A receiver slot 120 is defined in the front side of the base 110 by the sections 112A, 112B, 112C. The receiver slot 120 has a front opening 120A and is open on either side. The receiver slot 120 extends axially from the opening 120A along the axis A-A and is terminated by the front side of the rear section 112A.

A base terminal electrical connector assembly 131A, 131B is mounted in each of the upper and lower sections 112B, 112C. As discussed in more detail below, each connector assembly 131A, 131B include a cable clamp connector 133 and a terminal contact connector 170. The two socket connectors 170 serve as base electrical terminals of the base 110. A cable port 124 is defined in each of the upper and lower sections 112B, 112C to receive a terminal end of an electrical cable 20, 22 into the corresponding cable clamp connector 133. A driver port 126 is provided in each section 112B, 112C to receive a driver to operate a threaded member (e.g., screw) 169 of the associated cable clamp connector 133.

Upper and lower contact openings 121 are defined in the front side or wall 112E of the rear section 112A. The terminal contact connectors 170 extend out of the housing 112 through respective ones of the openings 121.

A spring-loaded remote control pin 122 projects forwardly from the front side 112E of the rear section 112A.

Figure 2:
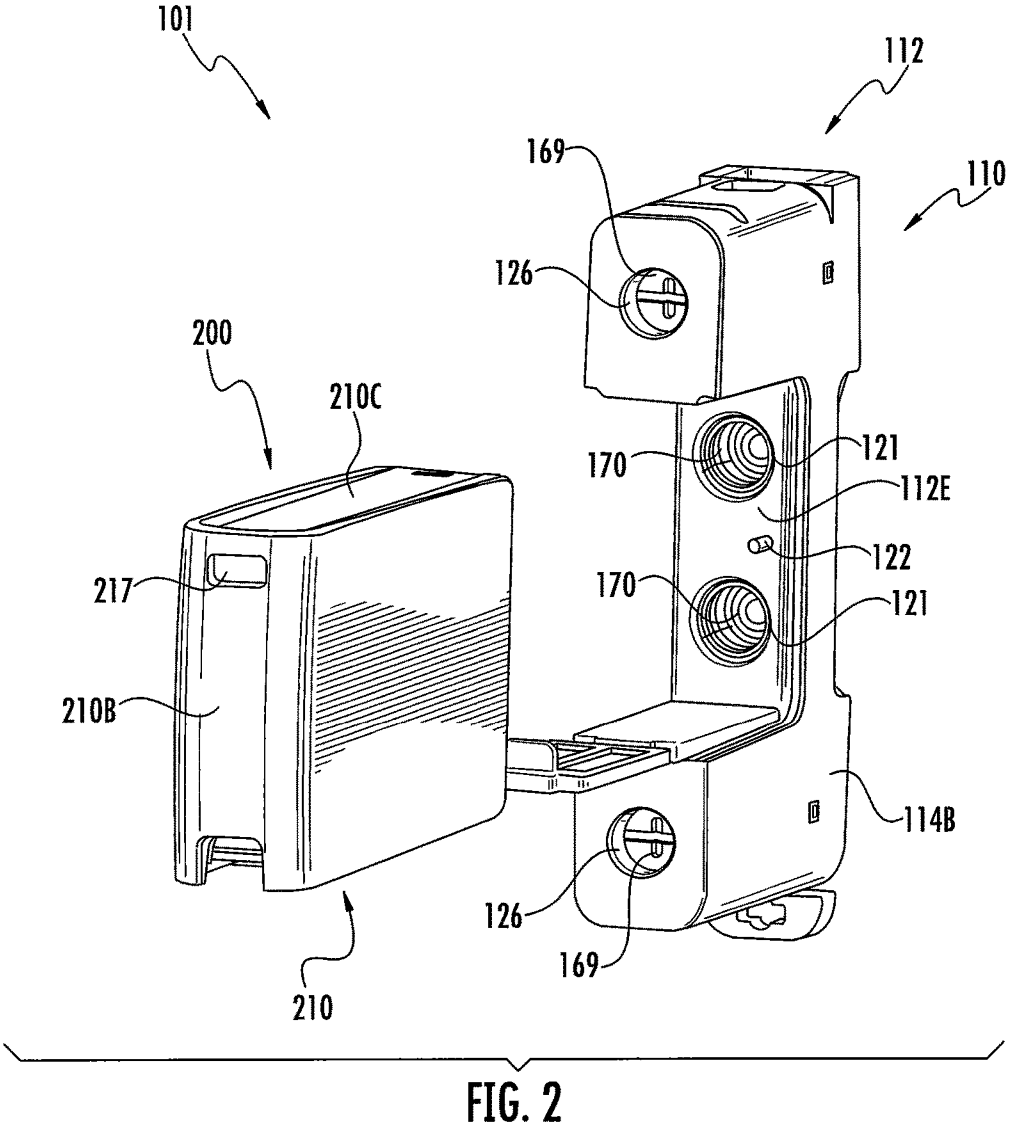
FIG. 2 is an exploded, front perspective view of the DIN rail device system of FIG. 1.
Figure 3:
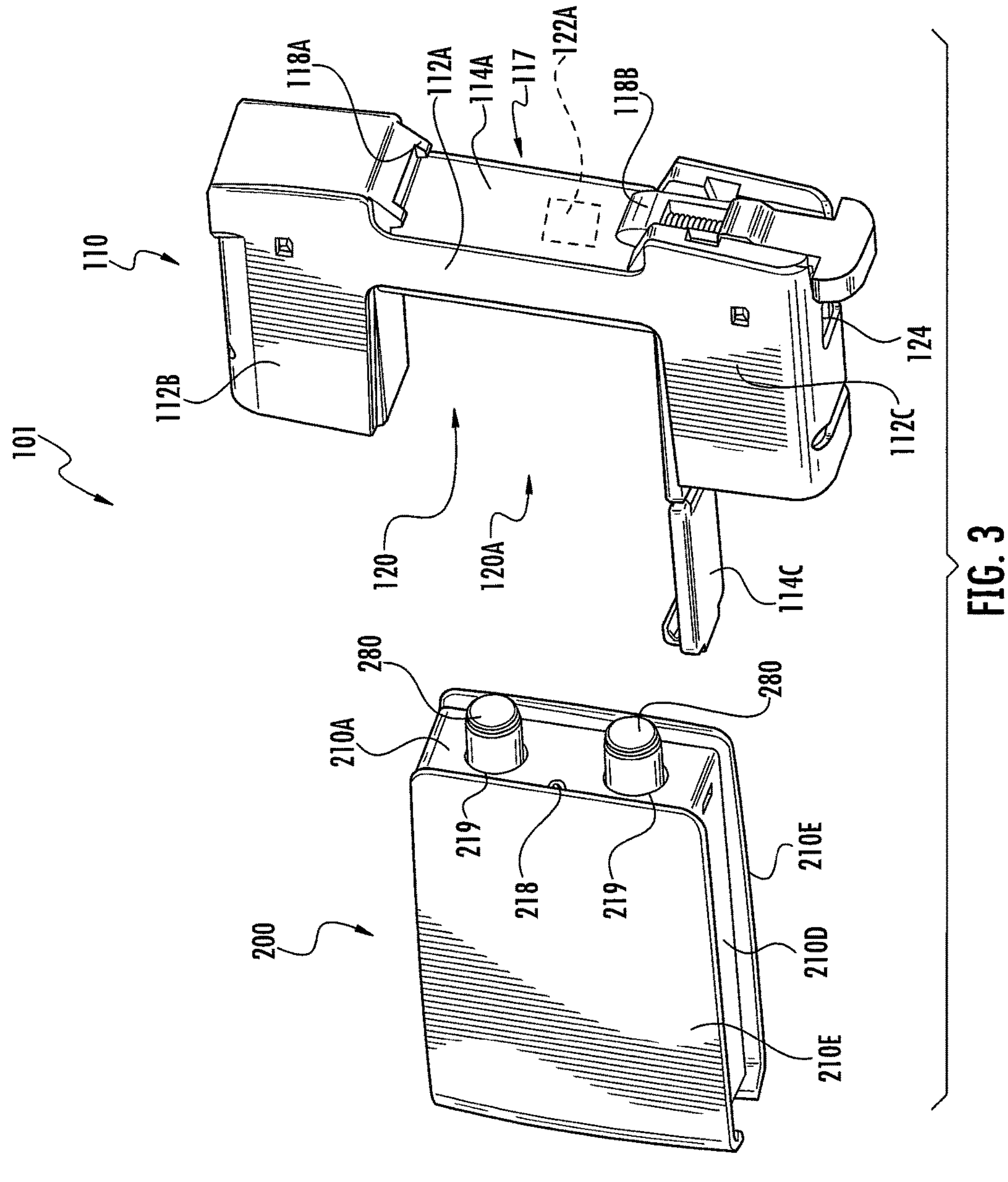
FIG. 3 is an exploded, rear perspective view of the DIN rail device system of FIG. 1.

The module 200 includes an inner housing member 212 and an outer housing member 214 collectively forming a housing 210 (FIG. 2). The housing 210 defines an internal chamber or cavity 216. The housing includes a rear wall 210A, a front wall 210B, a top wall 210C, a bottom wall 210D, and opposed side walls 210E.

The housing members 212, 214 may be formed of any suitable material or materials. In some embodiments, each of the housing members 212, 214 are formed of a rigid polymeric material. Suitable polymeric materials may include polyamide (PA), polypropylene (PP), polyphenylene sulfide (PPS), or ABS, for example.

A pair of carrier contact members 220, a GDT 222, the fail-safe mechanism 201, and the alarm mechanisms 203, 205 are enclosed within the cavity 216. The two terminal electrical contact or bullet connectors 280 each extend rearwardly outwardly from the rear wall 210A and serve as module electrical terminals.

A front indicator opening or window 217 is provided on the front wall 210B. The indicator window 217 may serve to visually indicate a change in status of the module 200, as discussed below.

A rear indicator opening or port 218 is provided in the rear wall 210A. The indicator port 218 may serve to indicate (e.g., mechanically, in cooperation with the remote control pin 122) a change in status of the module 200, as discussed below.

Terminal contact openings 219 are defined in the rear wall 210A.

The inner housing member 212 includes a spring channel 212A, an integral rail 212B, an indicator wall 212C, opposed integral trigger guides 212D, and an indicator strip guide slot 212E.

Figure 19:
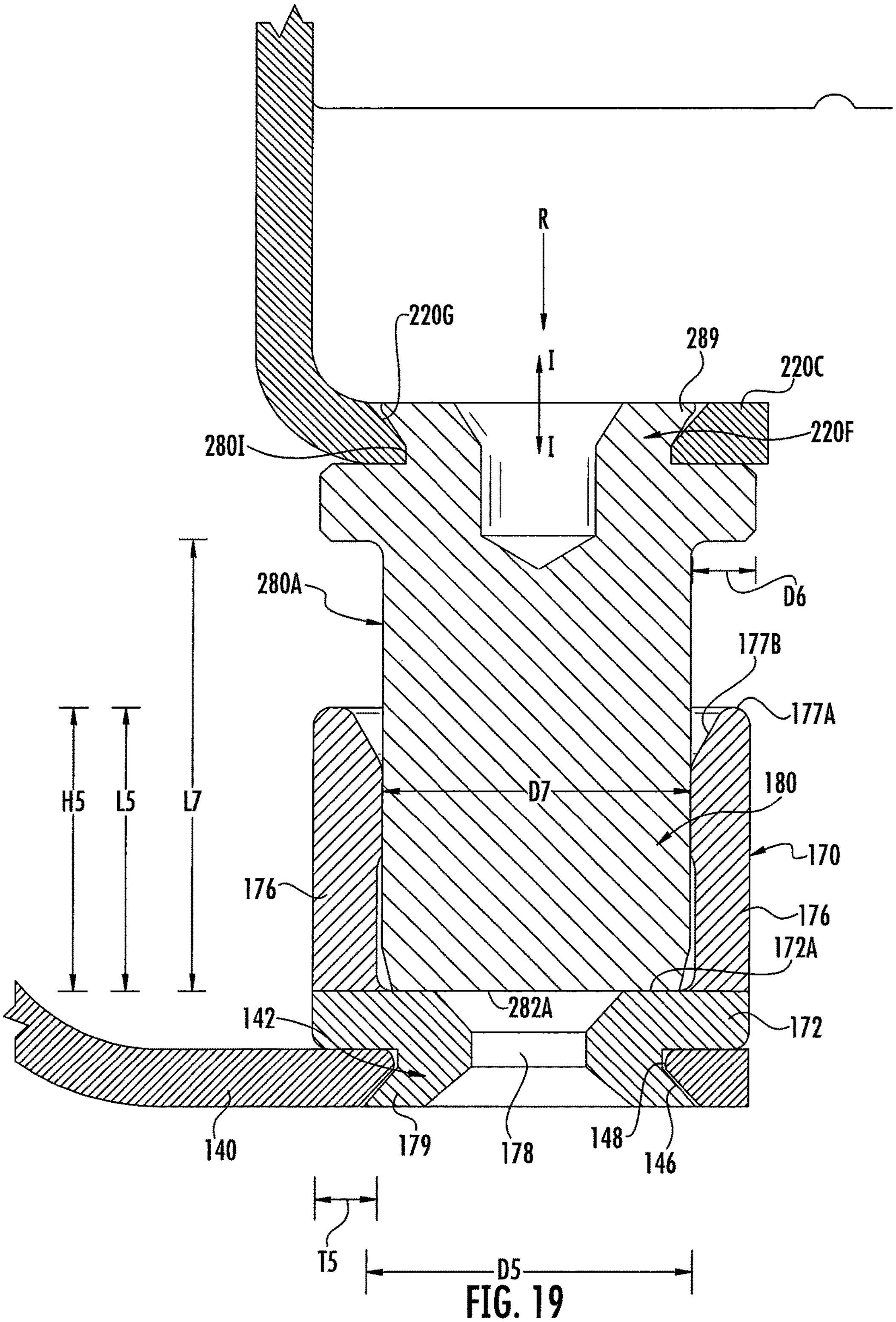
FIG. 19 is an enlarged, fragmentary, cross-sectional view of the DIN rail device assembly of FIG. 1 taken along the line 4-4 of FIG. 1.
Figure 20:
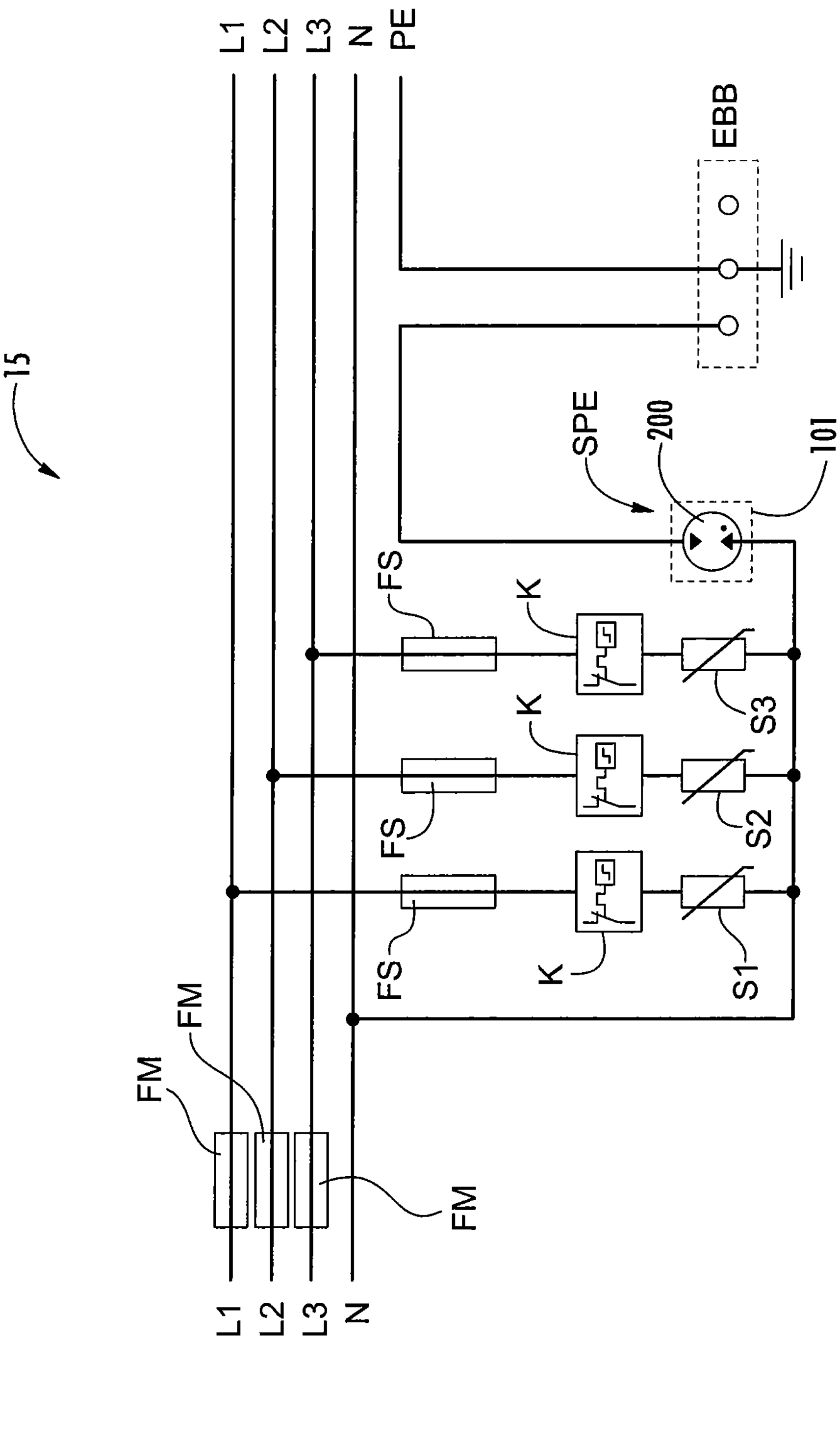
FIG. 20 is a schematic electrical circuit diagram of an electrical circuit installation including the DIN rail device assembly of FIG. 1.

The opposed carrier contact members 220 form a frame on which the GDT 222 is mounted. Each carrier contact member 220 includes a body 220A, a GDT termination hole 220B, a connector mount tab 220C, a fail-safe support tab 220D, and a shorting tab 220E. A connector mount hole 220F is defined in each mount tab 220C. Each mount hole 220F has an annular recess or chamfer 220G (FIG. 19).

According to some embodiments, each shorting tab 220E has a thickness T1 (FIG. 5) in the range of from about 0.5 mm to 5 mm.

According to some embodiments, each connector mounting tab 220C has a thickness T2 (FIG. 5) in the range of from about 0.5 mm to 5 mm.

The GDT includes a body 222A and an anode terminal 222B and a cathode terminal 222C on opposed ends of the body 222A. The body 222A contains an anode, a cathode and a spark gap chamber as is known in the art. Suitable GDTs may include EPCOS H30-E800XP type GDTs. Suitable GDTs may include the GasStart 16L33 GDTs rated at impulse currents from 12.5 kA to 150 kA and maximum continuous operating voltage from 240 V to 440 V.

The GDT terminals 222B, 222C are seated in the opposed GDT termination holes 220B. The terminals 222B, 222C mechanically and electrically connected to the opposed carrier contact members 220 by solder 222D in and/or about the termination holes 220B. The GDT 222 thereby spans and is electrically connected between the carrier contact members 220. The terminals 222B, 222C may instead or additionally be connected to the contact members 220 by riveting, screwing or welding.

In some embodiments, the solder joint is annular with a small annular gap between each terminal 222B, 222C and its hole 220B. In some embodiments, the width of the gap is in the range of from about 0.03 mm to 0.3 mm. In some embodiments, the gap is sized such that the solder 222D is drawn into the joint by capillary effect.

The GDT 222 also includes a locator feature or recess in the side of the body 222A facing the front end of the module 200.

The fail-safe mechanism 201 includes a fail-safe housing 224, a trigger assembly 240, a shorting member or bar 226, a pair of trigger springs 228, and a temperature responsive member 260 (hereinafter referred to as the meltable member). The local alarm mechanism 203 includes the components 224, 240, 228, 234, an indicator member 230, and an indicator spring 232. The remote alarm mechanism 205 includes the components 224, 240, 228, 234, and an indicator strip 236.

Figure 4:
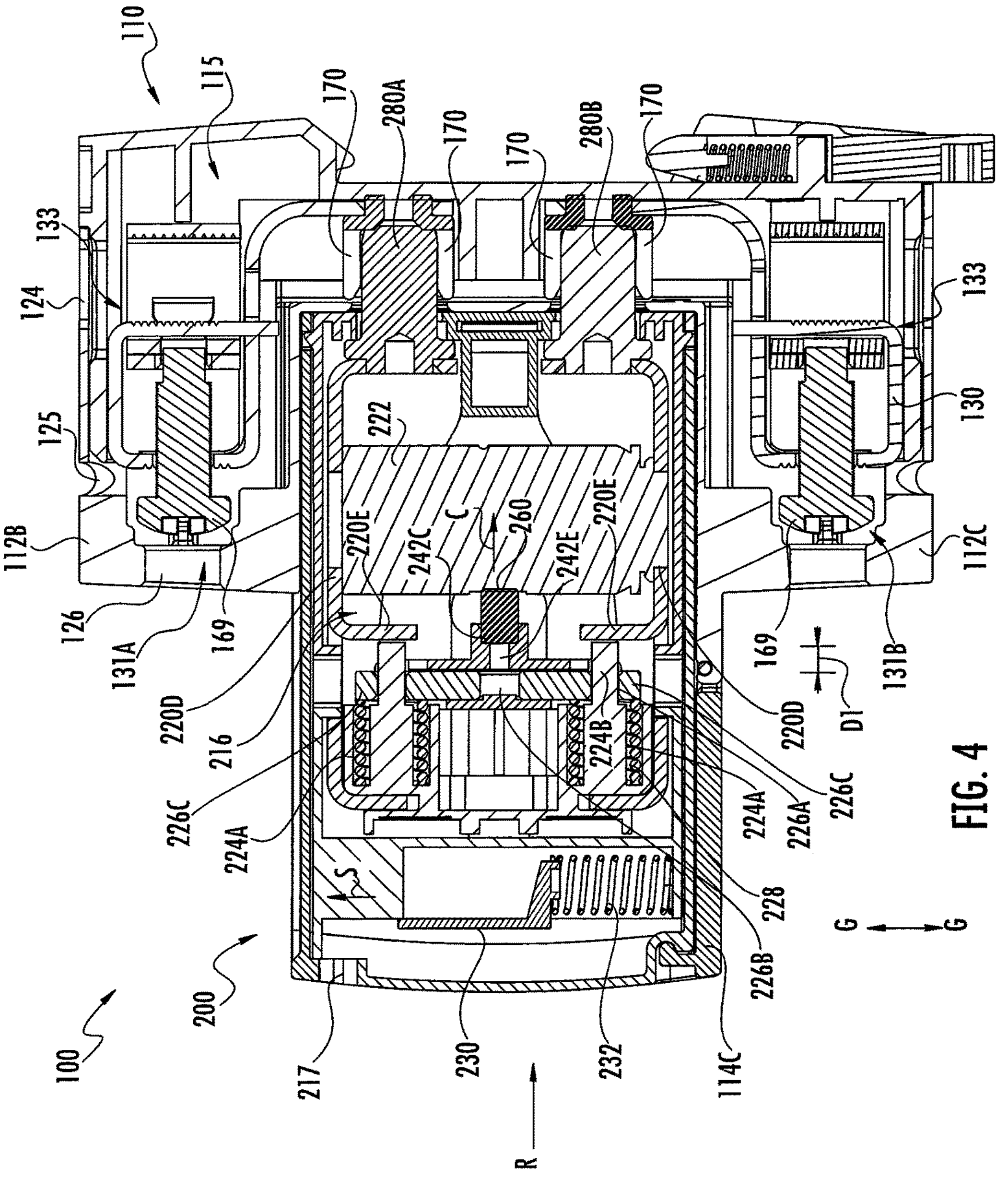
FIG. 4 is a cross-sectional view of the DIN rail device assembly of FIG. 1 taken along the line 4-4 of FIG. 1.
Figure 5:
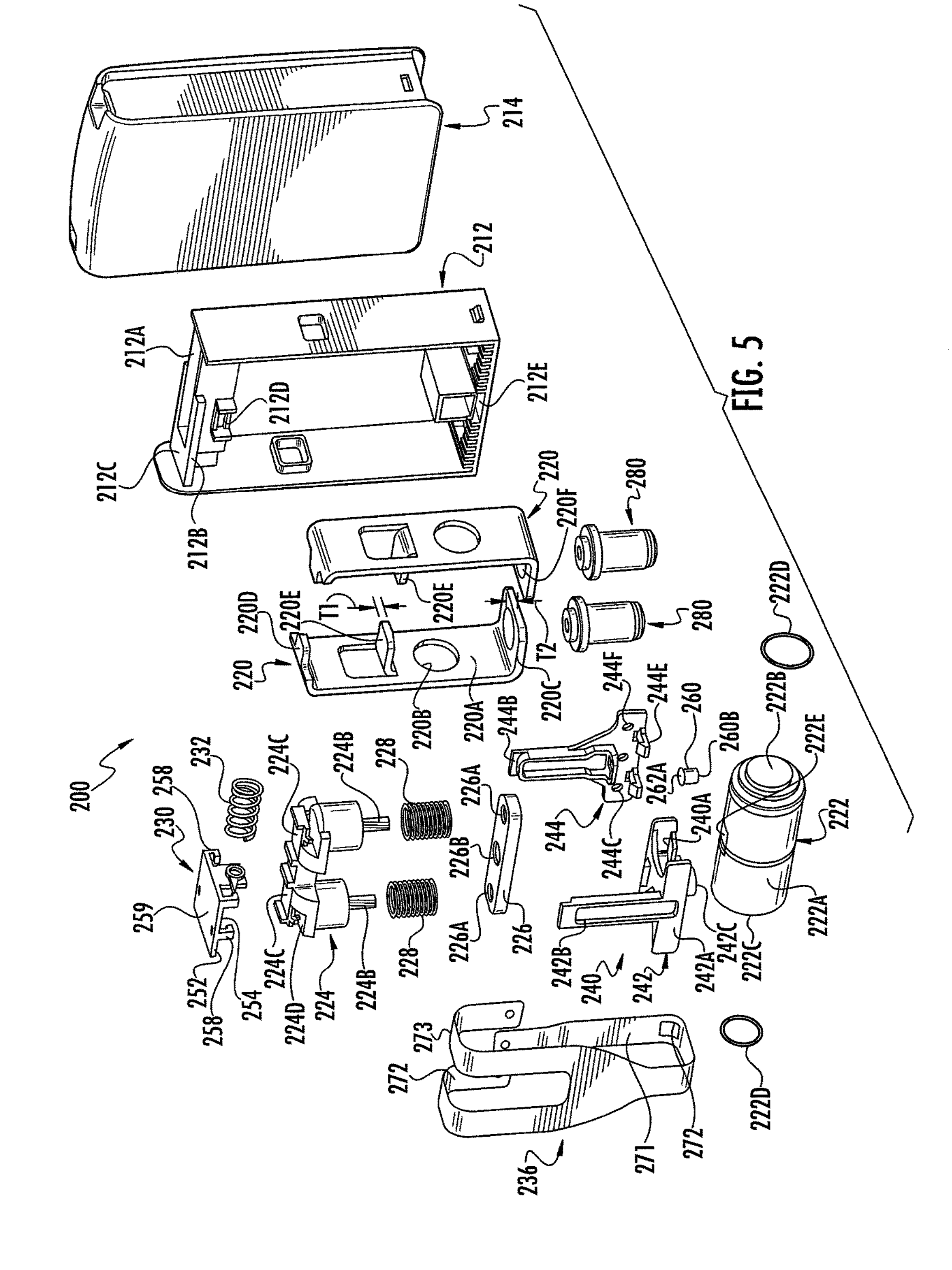
FIG. 5 is an exploded, perspective view of a GDT module forming a part of the DIN rail device system of FIG. 1.
Figure 6:
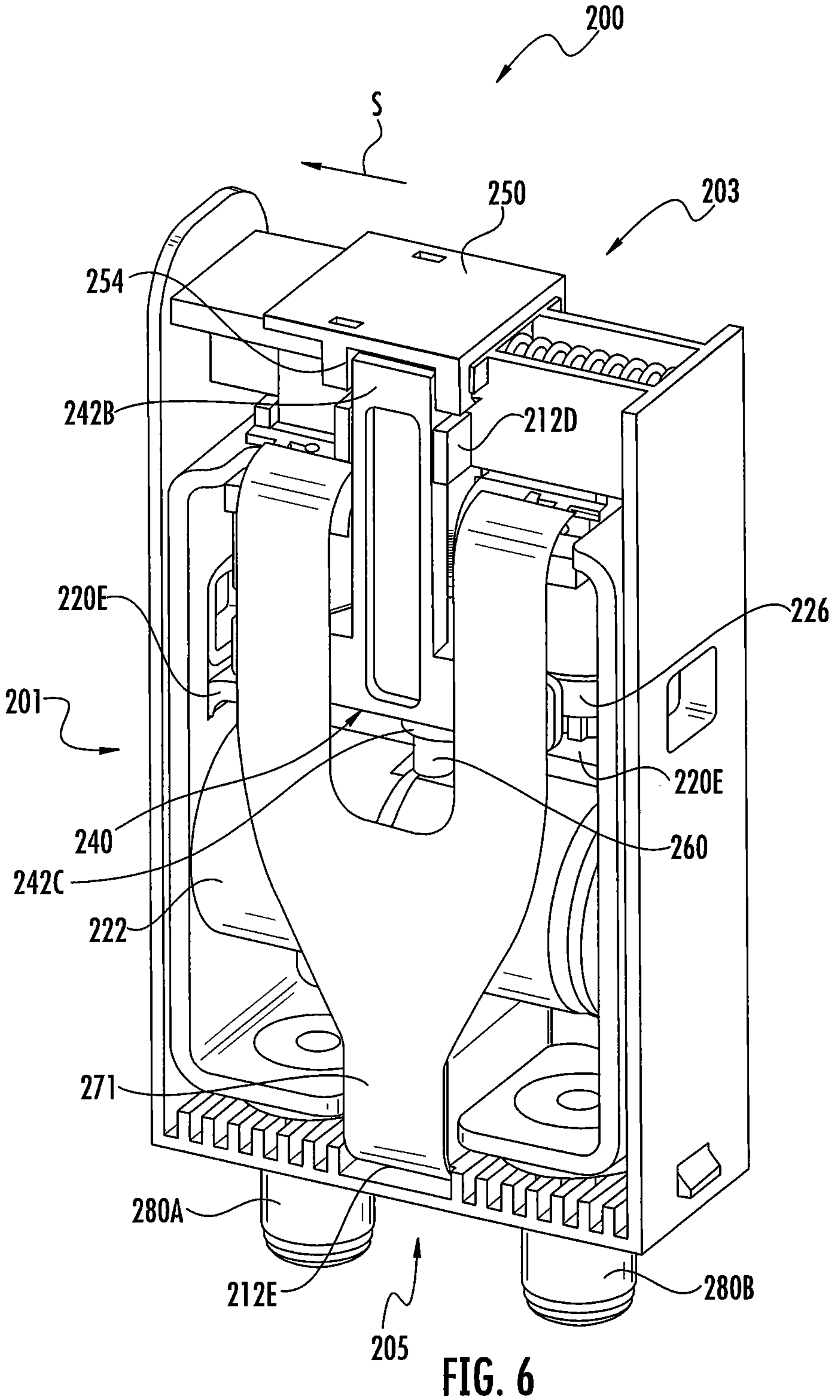
FIGS. 6 and 7 are opposing perspective views of the GDT module of FIG. 5 with an outer cover thereof removed, wherein a shorting bar of the GDT module is in a ready position and a trigger member of the GDT module is in a lock position.
Figure 7:
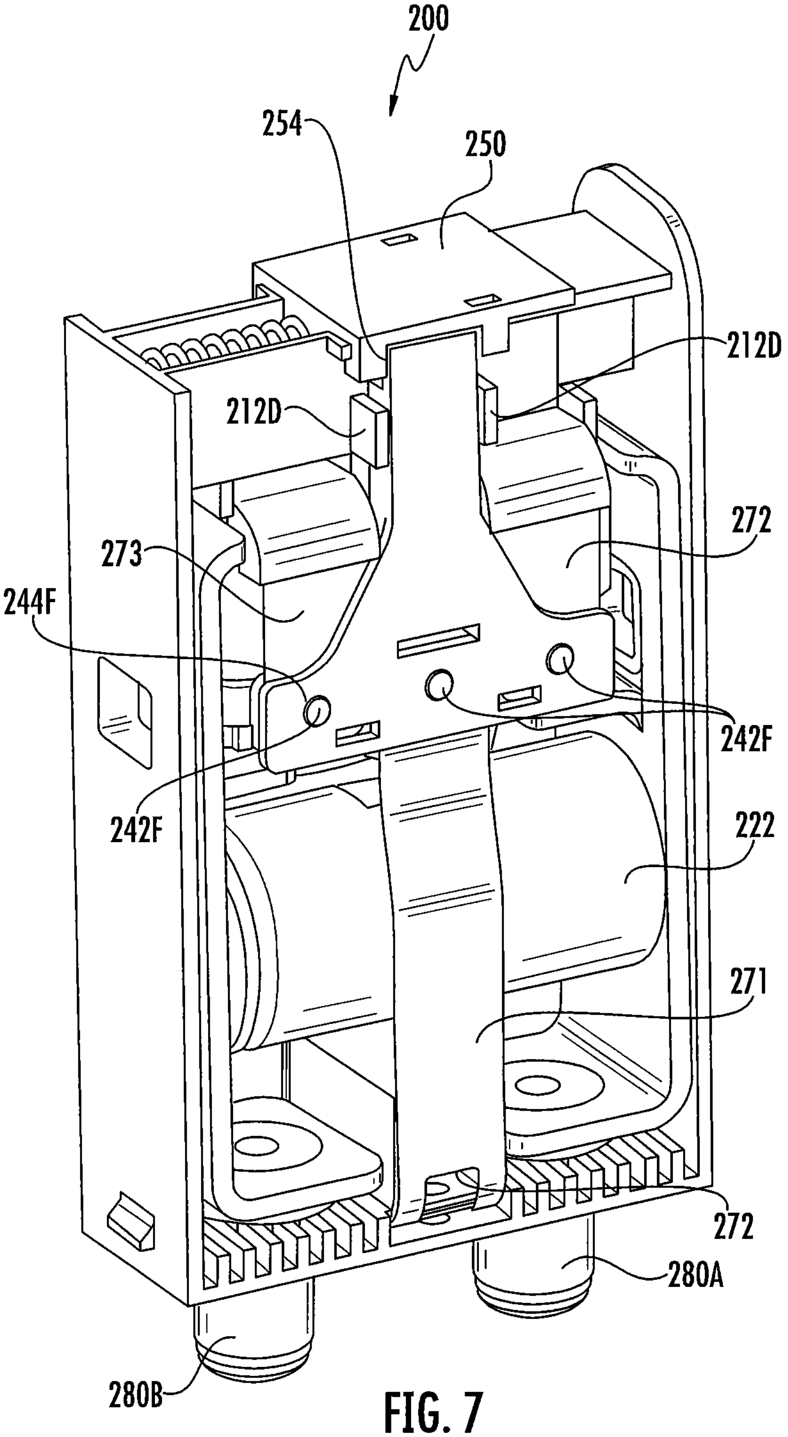
Figure 8:
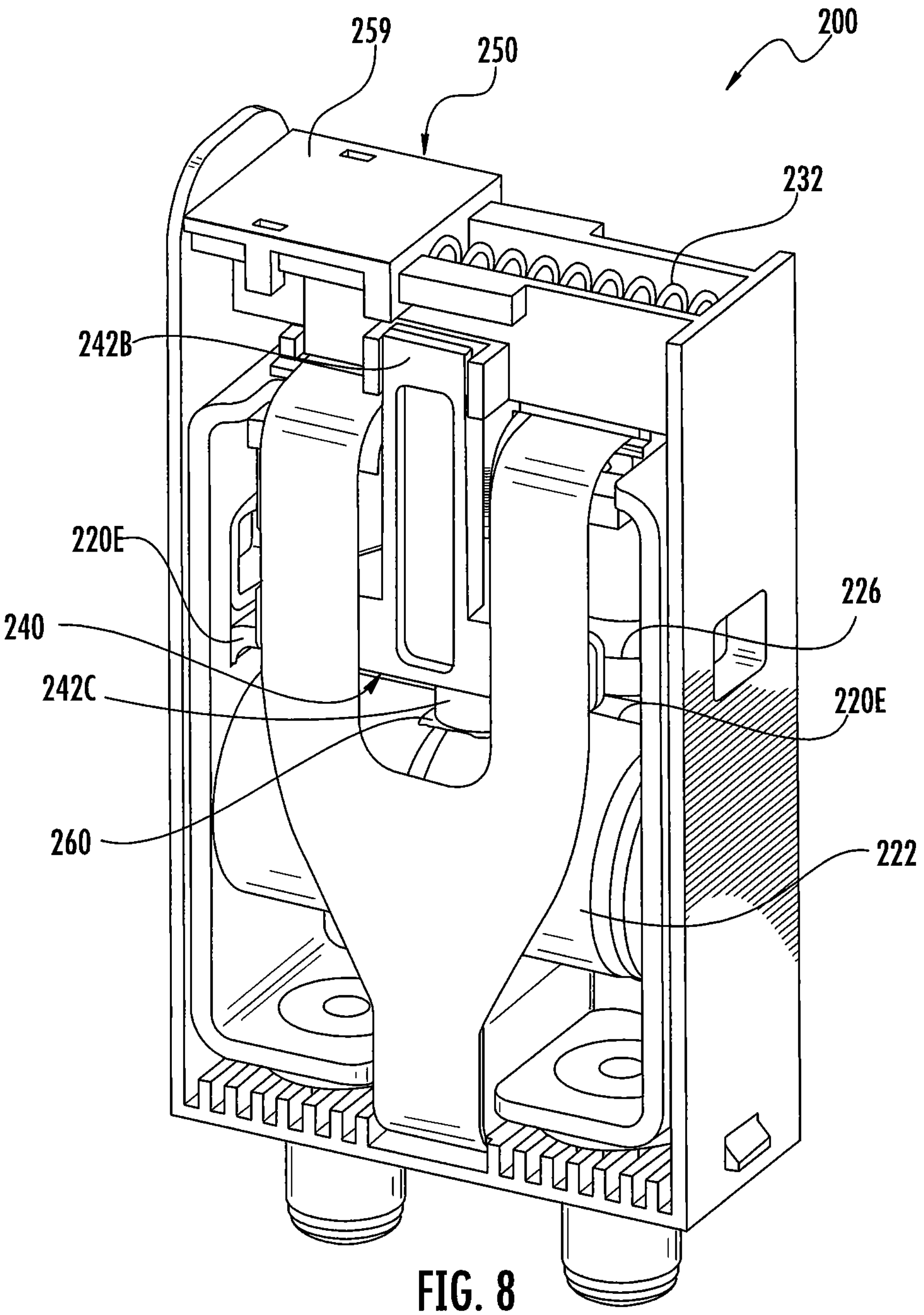
FIG. 8 is a perspective view of the GDT module of FIG. 5 with the outer cover removed, wherein the shorting bar is in a shorting position and the trigger member is in a release position.
Figure 9:
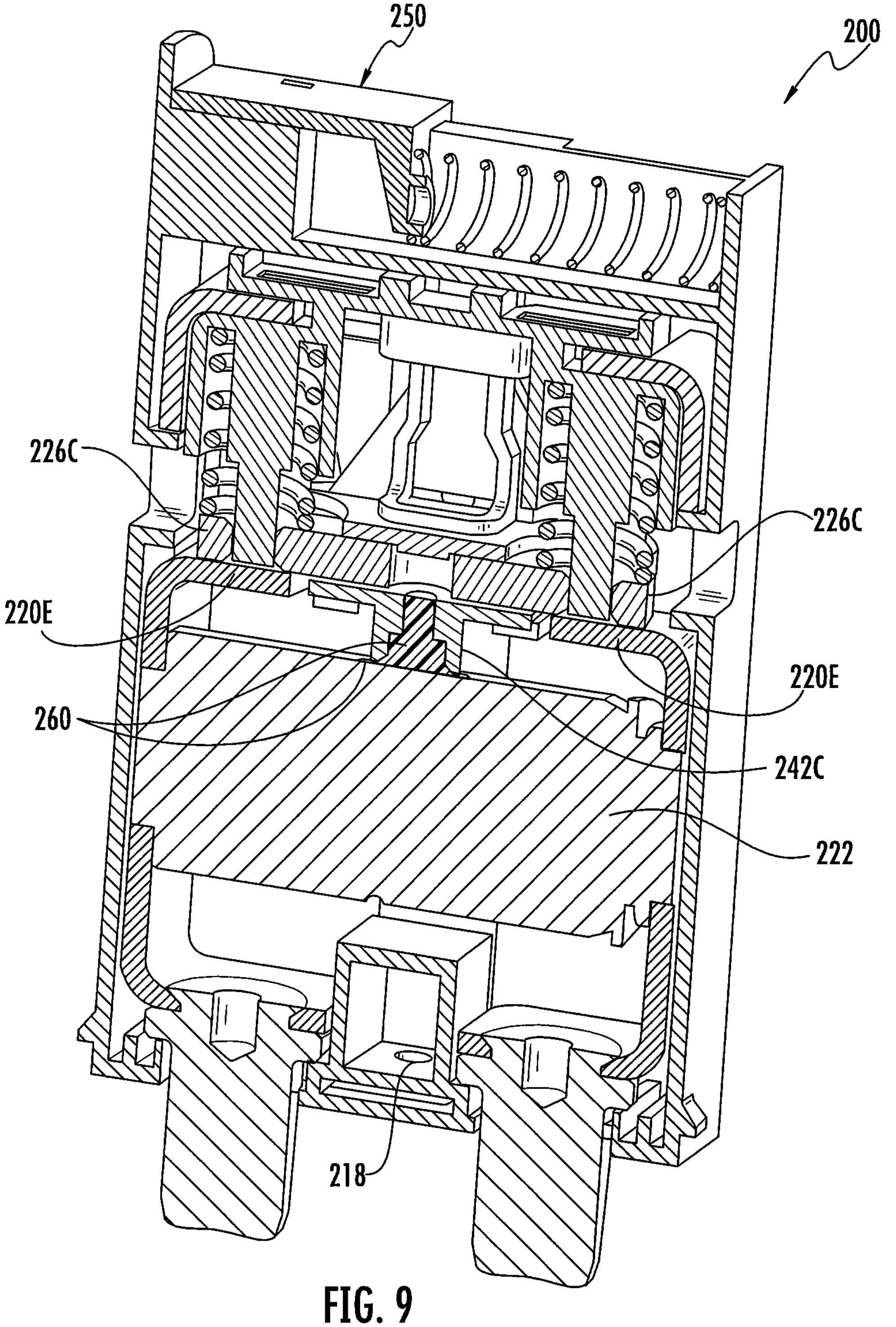
FIG. 9 is a cross-sectional, perspective view of the GDT module of FIG. 5 with the outer cover removed, wherein the shorting bar is in the shorting position and the trigger member is in the release position.
Figure 10:
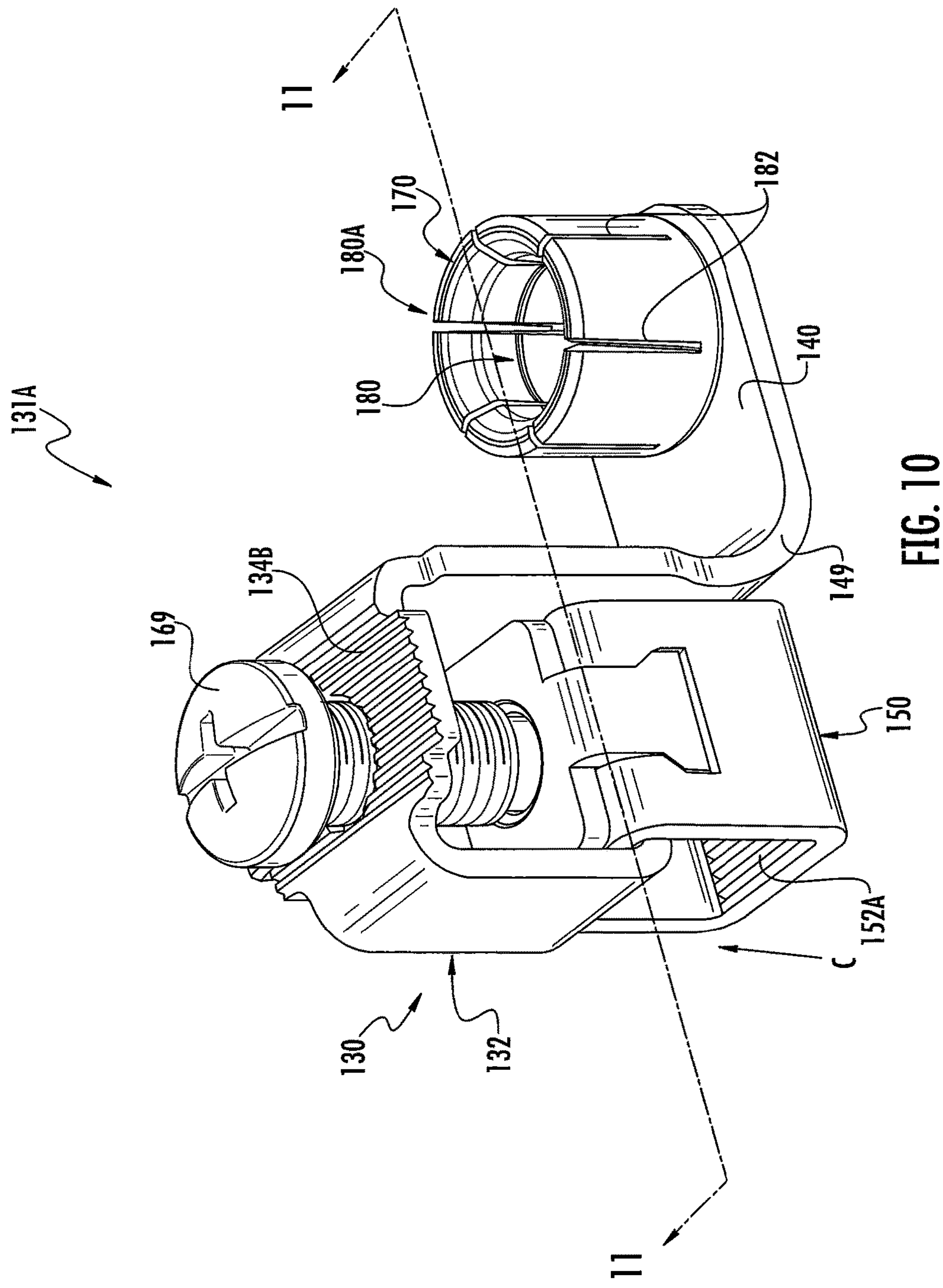
FIG. 10 is a front perspective view of a base terminal connector assembly forming a part of a base of the DIN rail device assembly of FIG. 1.

The fail-safe mechanism 201 also includes the shorting tabs 220E. FIGS. 4, 6 and 7 show the fail-safe mechanism 201 in a ready position or configuration, and FIGS. 8 and 9 show the fail-safe mechanism 201 in a triggered position or configuration.

The fail-safe housing 224 may be a unitary or monolithic body of electrical insulating material. The housing 224 includes a pair of side-by-side, annular spring slots 224A, a pair of side-by-side guide posts 224B, a pair of side-by-side strip guide slots 224C, and a pair of opposed mount slots 224D. The mount tabs 220D are received in the mount slots 224D to secure the fail-safe housing 224. The trigger springs 228 are seated in the spring slots 224A.

The trigger assembly 240 includes a first trigger member 242 and a second trigger member 244. The trigger member 244 is affixed to the trigger member 242 by integral connector features 244E (barbed tabs).

The trigger member 242 includes a body 242A having a shorting bar slot 240A defined therein. The shorting bar 226 is mounted in the shorting bar slot 240A for movement with the trigger assembly 240. The body 242A also includes an integral meltable member 260 mount slot 242C on its rear side. The meltable member 260 is mounted in the mount slot 242C. An overflow hole 242E is defined in the trigger member 242 in fluid communication with the mount slot 242C. Strip anchor posts 242F are provided along the outer edge of the body 242A. The trigger member 242 includes an integral latch portion or finger 242B extending forwardly from the body 242A and slidably seated in the trigger guide 212D on the same side of the module 200.

The trigger member 244 similarly includes an integral latch portion or finger 244B extending forwardly from its body and slidably seated in the opposing trigger guide 212D. The trigger member 244 includes strip anchor holes 244F aligned with and receiving the strip anchor posts 242F.

The shorting bar 226 is formed of an electrically conductive material. In some embodiments, the shorting bar 226 is formed of metal and, in some embodiments, copper. The shorting bar 226 may be generally shaped as an elongate plate or bar (e.g., as shown) or may be otherwise suitably shaped. The shorting bar 226 includes opposed contact end sections 226C. Guide holes 226A are defined in the end sections 226C. An overflow hole 226B is provided in the midsection of the shorting bar 226 in alignment in alignment with the overflow hole 242E. The shorting bar 226 is mounted in the mount slot 242C of the trigger member 242 and the guide posts 224B are slidably received in the guide holes 226A.

The meltable member 260 has opposed ends 262A and 262B. The end 262A is seated in or on the mount socket 242D and the end 262B is seated in or on the locator recess 222E of the GDT 222.

When the module 200 is assembled in the ready configuration (FIGS. 4, 6 and 7), the springs 228 are captured between the shorting bar 226 and the housing 224. The springs 228 are elastically compressed so that they exert a load against the shorting bar in a rearward direction R (FIG. 4; i.e., toward the GDT 222). The meltable member 260 is thereby captured and axially loaded between the shorting bar 226 and the GDT 222. The meltable member 260 spaces the shorting bar 226 axially away from the GDT 222 a prescribed distance such that the contact end sections 226C are axially spaced apart from the shorting tabs 220E a prescribed distance D1 (FIG. 4). The meltable member 260 is persistently compressively loaded by the springs 228 and the shorting bar 226 is maintained electrically isolated from the carrier contact members 220.

The indicator member 250 includes a body 252, opposed integral latch features or slots 254, mount tabs 258, and an indicator surface 259. The indicator member 250 is slidably secured to the rail 212B to slide along an indicator axis G-G (FIG. 4). The indicator spring 232 is seated in the spring channel 212A and one end of the indicator spring 232 engages the indicator member 250.

When the module 200 is assembled in the ready configuration (FIGS. 4, 6 and 7), the spring 232 is captured between the end wall of the channel 212A and the indicator member 250. The spring 232 is elastically compressed so that it exerts a biasing load against the indicator member 250 in a frontward direction (i.e., toward the window 217). The latch fingers 242B, 244B of the trigger assembly 240 are seated in the latch features 254. The interlocks between the latch fingers 242B, 244B and the latch features 254 secure the indicator member 250 in the ready position wherein the indicator surface 259 is not aligned with and visible through the window 217.

The indicator strip 270 includes three integral legs 271, 272, 273. The leg 271 is routed through the guide slot 212E and its end is affixed to the trigger assembly 240 by the central features 242F, 244F. The legs 272, 273 are routed through the guide slots 224C and their ends are affixed to the trigger assembly 240 by the outer features 242F, 244F. When the module 200 is assembled in the ready configuration (FIGS. 4, 6 and 7), the indicator hole 272 is not aligned with (i.e., is offset from) the rear opening 218. The indicator hole 272 is sized to receive the remote control pin 122 therethrough.

The fail-safe housing 224, the trigger members 242, 244, and the indicator member 250 may be formed of any suitable material or materials. In some embodiments, the components 224, 242, 244, 250 are formed of a rigid polymeric material. Suitable polymeric materials may include polyamide (PA), polypropylene (PP), polyphenylene sulfide (PPS), or ABS, for example.

The indicator strip 270 may be formed of any suitable material or materials. In some embodiments, the indicator strip 270 is formed of a resilient, flexible or compliant polymeric material. Suitable polymeric materials may include polyimide (kapton), PVC, ABS or PPS, for example.

The meltable member 260 may be formed of any suitable material or materials. In some embodiments, the meltable member 260 is formed of metal. Suitable metal materials may include alloys based on Bismuth and/or Indium and/or lead, for example. According to some embodiments, the meltable member 260 has a melting point in the range of from about 90° C. to 240° C. and, in some embodiments, in the range of from about 120° C. to 150° C.

The connector system 103 includes both a pair of base terminal connector assemblies 131A, 131B each forming a part of the base 110 and a pair of contact plug or bullet connectors 280A, 280B each forming a part of the module 200. Each connector assembly 131A, 131B includes a socket connector 170. When the module 200 is properly installed in the slot 120 of the base 110, the bullet connector 280A is inserted into and mechanically and electrically engages the socket connector 170 of the connector assembly 131A, and the bullet connector 280B is inserted into and mechanically and electrically engages the socket connector 170 of the connector assembly 131B. The bullet connectors 280A, 280B can be repeatedly inserted into and removed from the associated socket connectors 170. Each connector assembly 131A, 131B is also configured to mechanically and electrically engage an electrical cable 20, 22 (FIG. 1) inserted through a corresponding cable port 124.

The connector assembly 131A will be described in more detail hereinbelow. The connector assembly 131B may be constructed and operated in the same manner as the connector assembly 131A, and it will therefore be appreciated that the description below likewise applies to the connector assembly 131B.

The connector assembly 131A includes a connector body 130, a cage member 150, a threaded member 169, and a socket connector 170. In some embodiments, the threaded member 169 is a screw, as shown. The screw can be differently configured.

The connector body 130 is electrically conductive. The connector body 130 includes a cable termination portion 132, a module termination portion 140, and a bridge portion 149. The connector body 130 is formed of an electrically conductive material. In some embodiments, the connector body 130 is formed of metal. Suitable metals may include alloys of copper or CuZn and/or Sn. In some embodiments, the connector body 130 is unitary and, in some embodiments, the connector body 130 is monolithic.

According to some embodiments, the cable termination portion 132 and the bridge portion 149 each have a thickness T3 (FIG. 14) in the range of from about 0.4 mm to 5 mm.

The cable termination portion 132 includes a loop defining a cavity 135. A key slot 137 is defined in a bottom wall 134B of the portion 132 and a key tab 136 extends from a terminal edge of a rear wall 134A of the portion 132. The key tab 136 has an enlarged head 136A that is wider than the portion of the key slot 137 in which the key tab 136 is seated. The key tab 136 and the key slot 137 interlock to resist or prevent the end of the rear wall 134A from pulling away from the bottom wall 134B. A non-threaded screw hole 138 is defined in a front wall 134C.

A mounting hole 142 is defined in the module termination portion 140 by an annular inner edge 148. A chamfer recess 146 surrounds the mounting hole 142.

The bridge portion 149 is curvilinear in profile. In some embodiments and as shown, the profile of the bridge portion 149 is a smooth curve (i.e., the curved section forming the bridge portion 149 does not have a corner or corners). In some embodiments and as shown, the profile of the bridge portion 149 has an arc radius R1 (FIG. 14) in the range of from about 1 mm to 30 mm. In some embodiments and as shown, the profile of the bridge portion 149 has an arc length in the range of from about 5 mm to 6 mm.

The cage member 150 includes a rear wall 152A, opposed side walls 152B, 152C, an inner front wall 152D, and an outer front wall 152E defining a cavity 151. An integral key tab 154 extends from a terminal edge of the outer front wall 152E. An integral straight tab 156 extends from a terminal edge of the inner front wall 152D. A key slot 158 is defined in the side wall 152B and a straight slot 160 is defined in the side wall 152C. A non-threaded through hole 162 is defined in the outer front wall 152E. An integral flange 168 projects forwardly from the inner front wall 152D and is seated in the hole 162. A threaded through hole 164 is defined the flange 168 and the inner front wall 152D. Screw threads 164A are formed on the inner surface of the hole 164.

The key tab 154 is interlocked with the key slot 158 and the straight tab 156 is seated in the slot 160. These engagements, as well as the interlock between the flange 168 and the hole 162, resist or prevent the walls 152A-E from pulling away from one another.

The cage member 150 is electrically conductive. In some embodiments, the cage member 150 is formed of metal. Suitable metals may include alloys of copper such as CuZn or alloys of iron. In some embodiments, the cage member 150 is unitary and, in some embodiments, the cage member 150 is monolithic.

In some embodiments, the cage member 150 is formed from single sheet of metal that is bent to the shape of the cage member 150. The flange 168 may be formed using a deep draw process.

According to some embodiments, each of the walls 152A-E has a thickness T4 (FIG. 17) in the range of from about 0.5 mm to 5 mm.

The cage member 150 encircles the rear wall 134A of the connector body 130. The screw 169 extends through the hole 138 and is threadedly mated with the hole 164. In use, the screw 169 can be rotated to drive the screw 169 into the cage member 150 through the hole 164, thereby pulling the cage member 150 in a direction C toward the front wall 134B. In that way, the walls 134A and 152A are pulled together to capture and compressively load a cable end therebetween.

The socket connector 170 includes a body 172, an integral mount feature or flange 174, and six integral fingers 176. The body 172 includes a base wall 172A. A through hole 178 extends through the base wall 172 and flange 174.

Each finger 176 is cantilevered and extends forwardly from a base end 176A merged with the body 172 at the base wall 172A to a free end 176B. Each free end 176B has a rounded entry surface 177A and a ramped inner shoulder surface 177B. The fingers 176 are circumferentially distributed about the base wall 172A such that the fingers 176 and the base wall 172A collectively define a socket 180 having an opening 180A. The socket 180 is substantially cylindrical. The fingers 176 are radially deflectable. Slots 182 are defined between the side edges of adjacent fingers 176 to permit the fingers 176 to radially deflect independently of one another.

Figure 11:
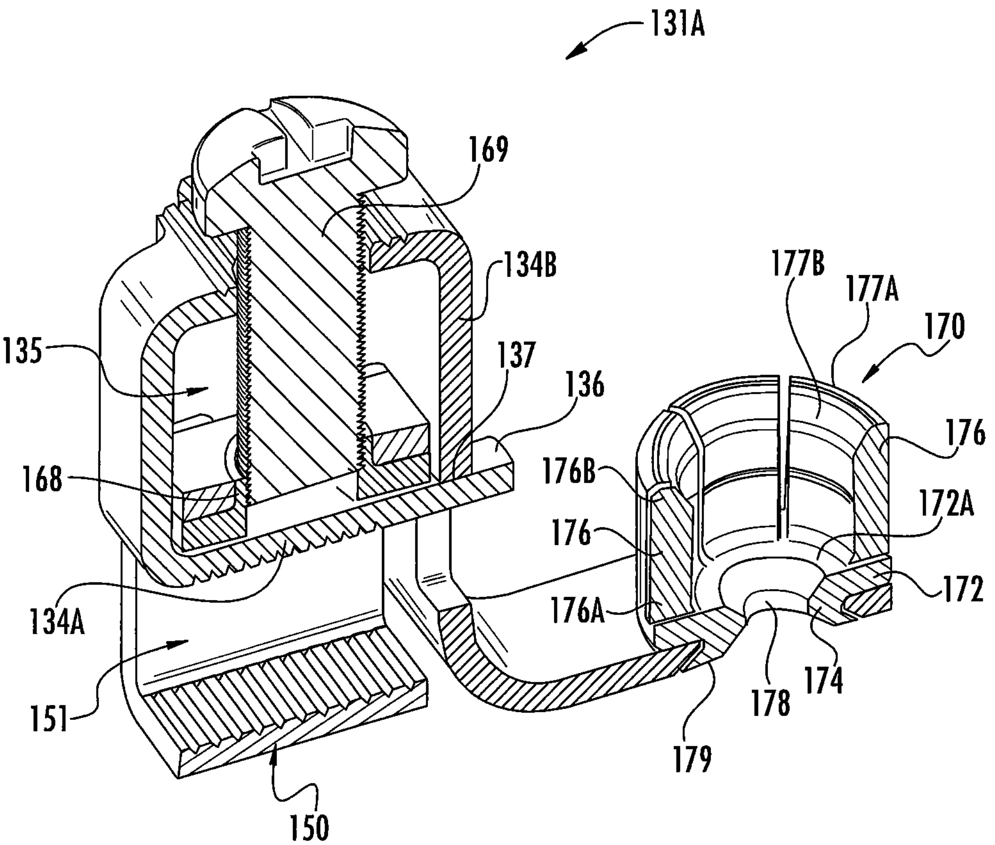
FIG. 11 is a cross-sectional, perspective view of the base terminal connector assembly of FIG. 10.

The socket connector 170 is secured or affixed directly to the portion 140 by the mount flange 174. In some embodiments and as shown in FIGS. 11 and 19, the mount flange 174 is seated in the hole 142 and is orbital riveted to the portion 140. More particularly, an integral, annular flared or deformed portion 179 of the flange 174 is shaped or formed (e.g., cold formed) by an orbital riveting technique and apparatus and fills the chamfer recess 146. The outer diameter of the deformed portion 179 is greater than the diameter of the inner edge 148, so that the deformed portion 179 prevents the socket connector 170 from being displaced from the hole 142. In some embodiments, the orbital riveting process is executed such that the body 172 fits flush or tightly against the facing surface of the portion 140. In some embodiments, the deformed portion 179 is tubular.

Figure 12:
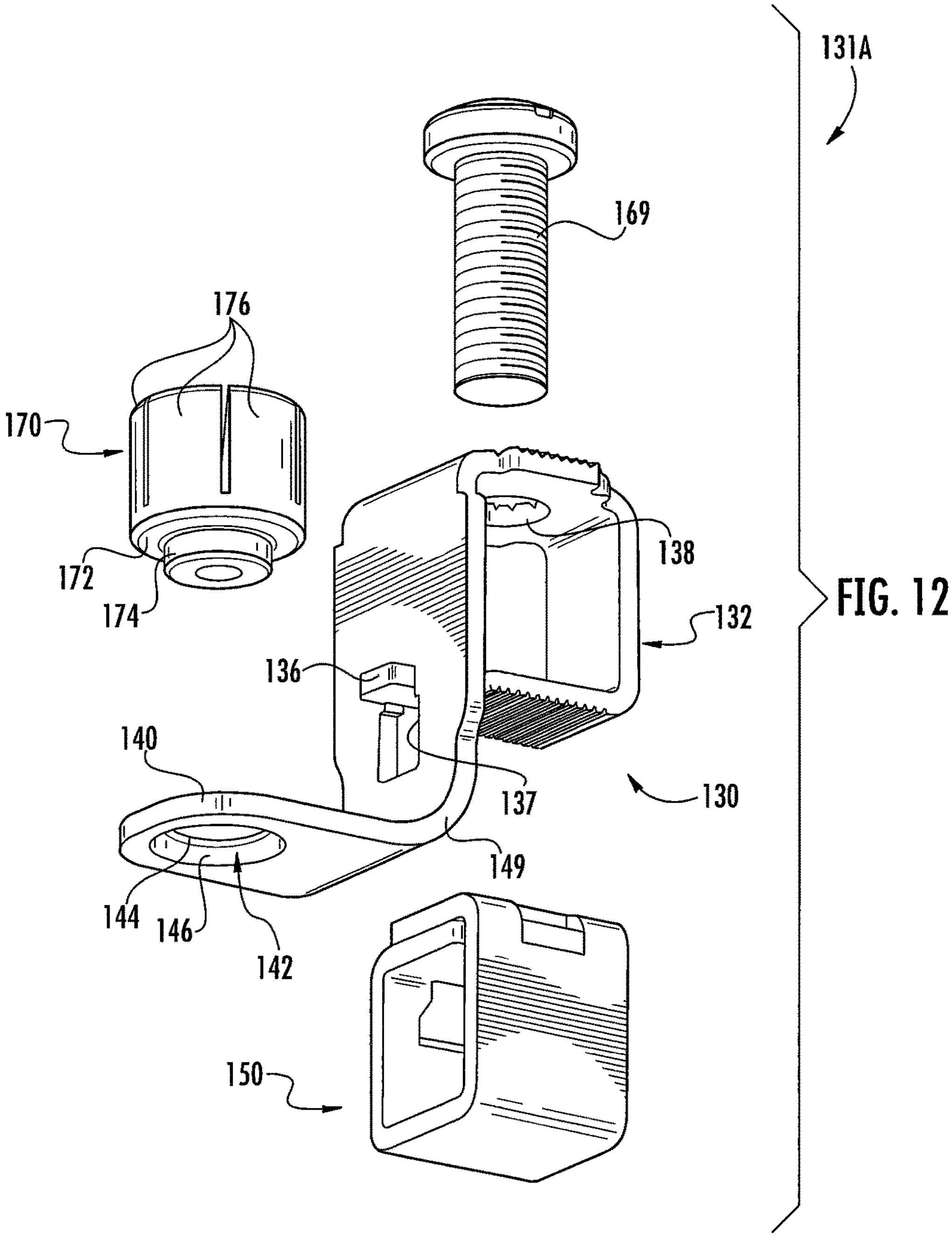
FIG. 12 is an exploded, rear perspective view of the base terminal connector assembly of FIG. 10.
Figure 13:
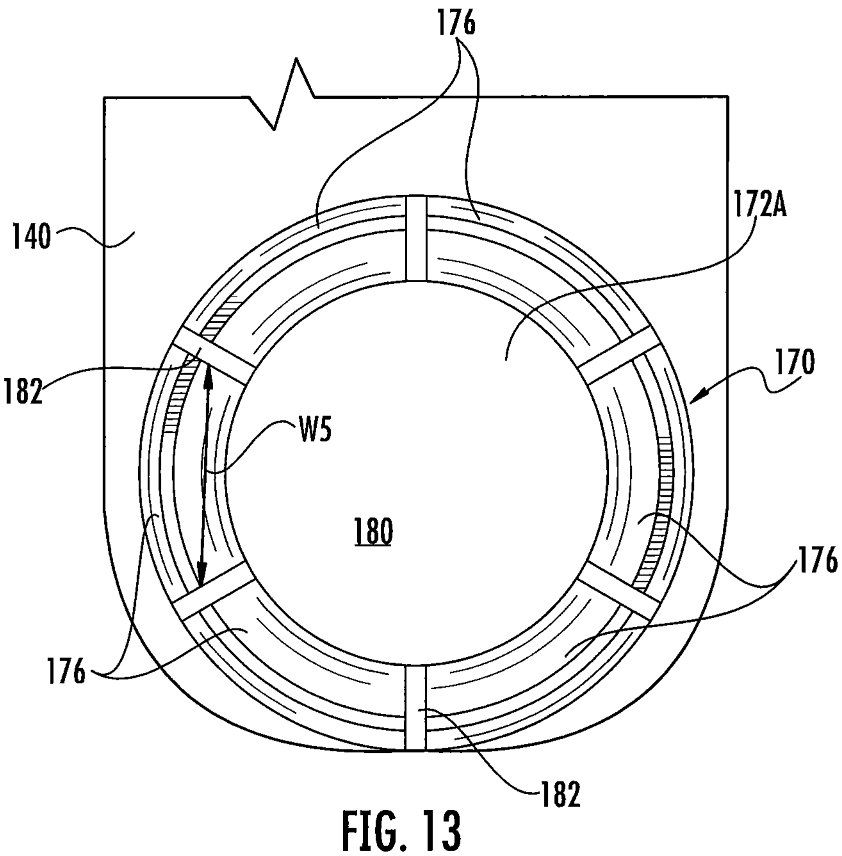
FIG. 13 is a fragmentary, top plan view of the base terminal connector assembly of FIG. 10.
Figure 14:
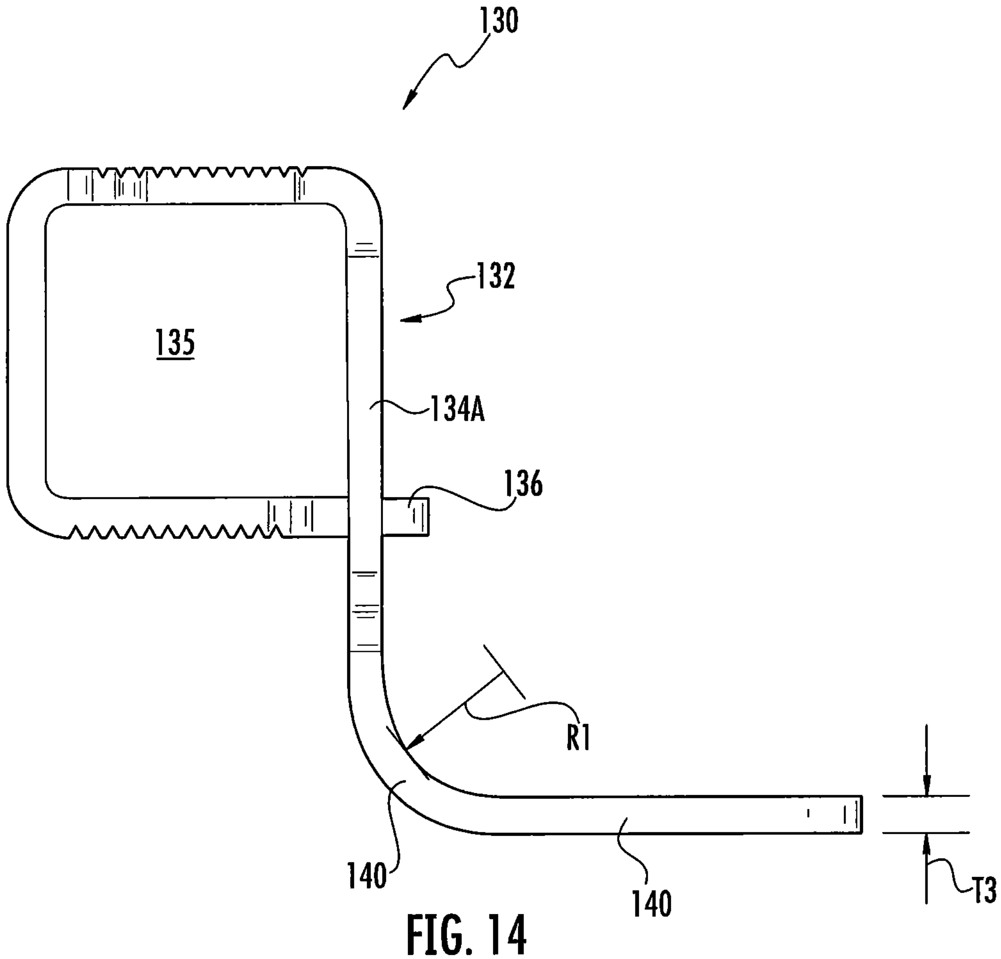
FIG. 14 is a side view of a connector body forming a part of the base terminal connector assembly of FIG. 10.
Figure 15:
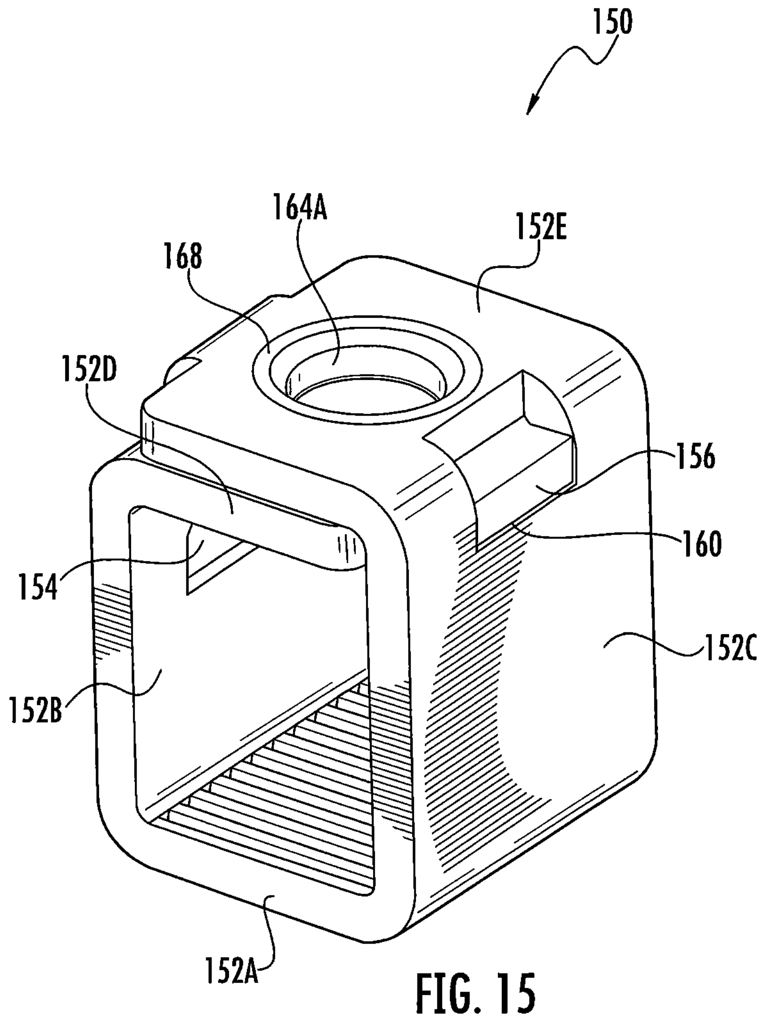
FIG. 15 is a top perspective view of a cage member forming a part of the base terminal connector assembly of FIG. 10.
Figure 16:
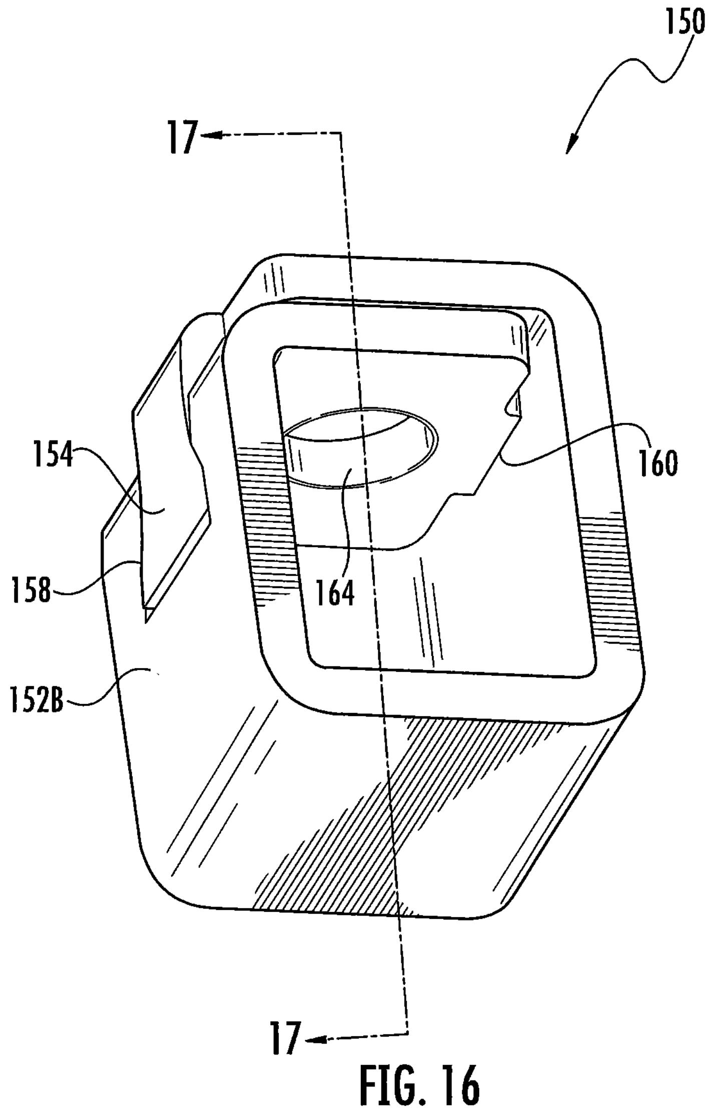
FIG. 16 is a bottom perspective view of the cage member of FIG. 15.
Figure 17:
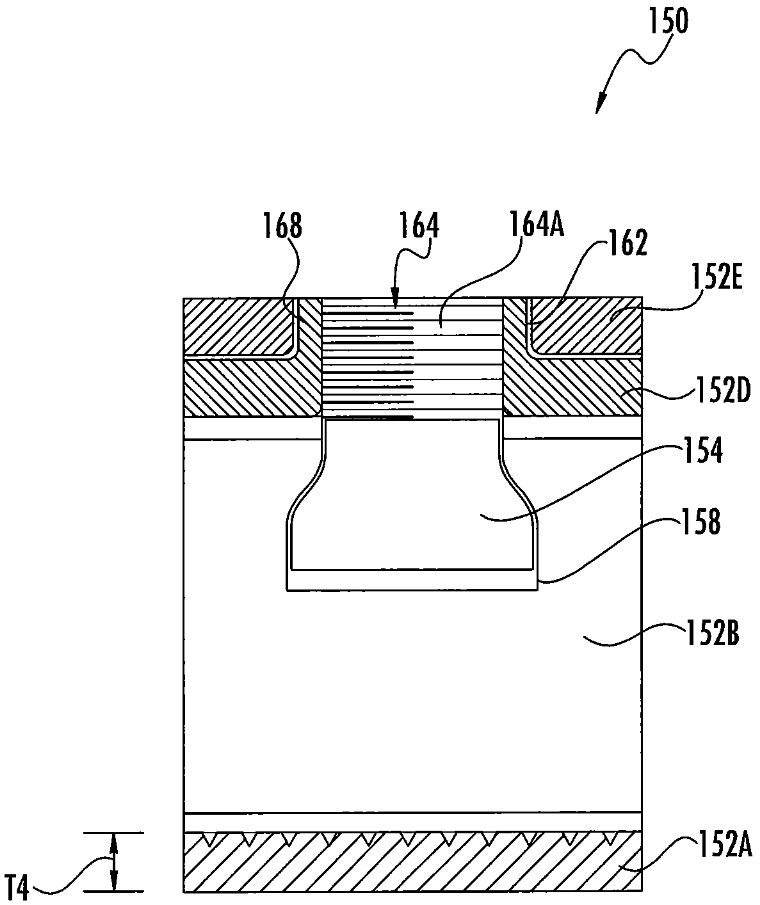
FIG. 17 is a cross-sectional view of the cage member of FIG. 15 taken along the line 17-17 of FIG. 16.

FIG. 12 illustrates the configuration of the socket connector 170 prior to being orbital riveted. As is known in the art, in the orbital riveting process a forming tool (peen) is gradually lowered into the flange 174 and thereby spreads the material of the flange 174 into the chamfer recess 146 and into the shape of the deformed portion 179.

According to some embodiments, the length L5 (FIG. 19) of each finger 176 is in the range of from about 3 mm to 20 mm. According to some embodiments, the thickness T5 (FIG. 19) of each finger 176 is in the range of from about 0.5 mm to 3 mm. According to some embodiments, the width W5 (FIG. 13) of each finger 176 is in the range of from about 1 mm to 10 mm. According to some embodiments, the depth 115 of the socket 180 is in the range of from about 3 mm to 20 mm.

According to some embodiments of each ramped inner shoulder surface 177B forms an oblique angle relative to the central axis of the socket 180. In some embodiments, the angle is in the range of from about 5 degrees to 45 degrees.

According to some embodiments of each slot 182 is in the range of from about 0.2 mm to 2 mm.

In other embodiments, there may be more or fewer than six fingers 176.

The socket connector 170 (including the fingers 176) is electrically conductive. In some embodiments, the socket connector 170 is formed of metal. Suitable metals may include an alloy of copper such as CuZn. In some embodiments, the socket connector 170 is unitary and, in some embodiments, the socket connector 170 is monolithic.

The bullet connector 280A will be described in more detail hereinbelow. The bullet connector 280B may be constructed and operated in the same manner as the bullet connector 280A, and it will therefore be appreciated that the description below likewise applies to the bullet connector 280B.

The bullet connector 280A extends from a base end 283A to a free end 283B. The bullet connector 280A includes a post body 282, an integral mount flange 286, and an integral radial flange 284.

The post body 282 has an end face 282A at the free end 283B and a generally cylindrical outer sidewall surface 282B. A tapered, rounded, ramped or frusto-conical shoulder 282C extends axially between the end face 282A and the sidewall surface 282B.

The radial flange 284 is annular and projects radially outwardly from the sidewall surface 282B a distance D6 (FIG. 19). According to some embodiments, the distance D6 is in the range of from about 0 mm to 5 mm.

The mount flange 286 is annular and is located on the base end 283A. An end bore 288 extends through the mount flange 286 and into the post body 282.

The bullet connector 280A is secured or affixed directly to the tab 220C of the associated carrier contact member 220 by the mount flange 286. In some embodiments and as shown, the mount flange 286 is seated in the hole 220F and is orbital riveted to the tab 220C. More particularly, an integral, annular deformed portion 289 of the flange 286 is formed by an orbital riveting technique or apparatus and fills the chamfer recess 220G. The outer diameter of the deformed portion 289 is greater than the diameter of the inner edge 220I, so that the deformed portion 289 prevents the bullet connector 280A from being displaced from the hole 220F. In some embodiments, the orbital riveting process is executed such that the radial flange 284 fits flush or tightly against the facing surface of the tab 220C.

Figure 18:
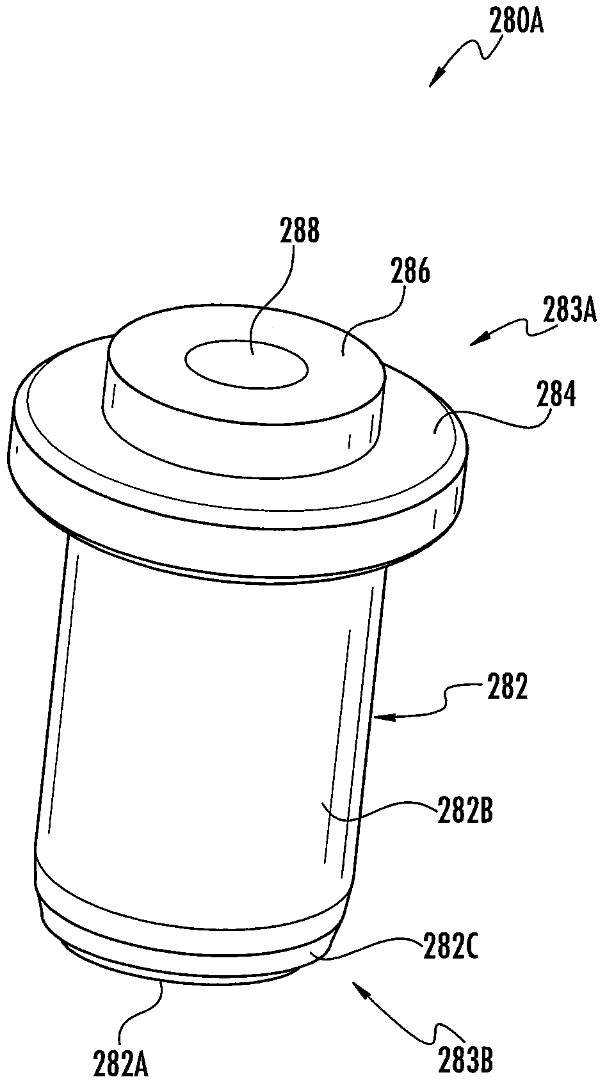
FIG. 18 is a front perspective view of a bullet connector forming a part of the GDT module of FIG. 5.

FIG. 18 illustrates the configuration of the bullet connector 280A prior to being orbital riveted. As is known in the art, in the orbital riveting process the forming tool (peen) is gradually lowered into the flange 286 and thereby spreads the material of the flange 286 into the recess 220G and into the shape of the deformed portion 289.

According to some embodiments, the length L7 (FIG. 19) of the post body 282 from the radial flange 284 to the end face 282A is in the range of from about 5 mm to 40 mm. According to some embodiments, the length L7 is in the range of from about 90 to 100 percent of the depth D5 of the associated socket 180.

According to some embodiments, the outer diameter D7 (FIG. 19) of the post body 282 is in the range of from about 8 mm to 8.02 mm. According to some embodiments, the outer diameter D7 is in the range of from about 102 to 103 percent of the inner diameter D5 (FIG. 19) of the associated socket 180 when the fingers 176 are relaxed.

The bullet connector 280A is electrically conductive. In some embodiments, the bullet connector 280A is formed of metal. Suitable metals may include copper alloys such as CuZn. In some embodiments, the bullet connector 280A is unitary and, in some embodiments, the bullet connector 280A is monolithic.

The system 101 may be used as follows in accordance with methods of the present invention.

The base 110 is mounted on the DIN rail 10 as shown in FIG. 1. The DIN rail 10 is received in the channel 117 and secured by the hooks 118A and the latch mechanism 118B.

Cables 20, 22 (shown in dashed line) are inserted through the cable ports 124 and secured in the clamp connectors 133. In some embodiments, the cable 20 is connected to Neutral (N) and the cable 22 is connected to Protective Earth (PE)

More particularly, the end of the electrical conductor (which is bare of insulation and exposed) of each cable 20 is inserted into the cavity 151 of the cage member 150. The screw 169 is then forcibly rotated to pull the wall 152A of the cage member 150 forward toward the wall 134A. The end of the cable 20 is thereby clamped between the walls 152A, 134A to directly mechanically and electrically connect the cable 20, 22 to the cable termination portion 132 of the connector assembly 131A, 131B. A remote control wire or connector (not shown) may be inserted into the port 125 and secured to the cable termination portion 132 by clamping between the head of the screw 169 and the wall 134B.

The module 200 is then axially plugged or inserted into the receiver slot 116 in an insertion direction R along the axis A-A through the front opening 120. The module 200 is pushed back into the receiver slot 120 until the rear end of the module 200 substantially engages the front side of the rear housing section 112A, as shown in FIGS. 1 and 4.

Insertion of the module 200 into the slot 116 causes the post body 282 of each bullet connector 280A, 280B to be inserted into the socket 180 of the corresponding socket connector 170 along an insertion axis I-I until the post body 282 is seated in the socket 180 as shown in FIGS. 4 and 19. In some embodiments, the central axis of each post body 282 is substantially concentric with the central axis of the socket 180 within which it is seated.

Because the outer diameter D7 of each post body 282 is greater than the relaxed (nondeflected) inner diameter D5 of its socket 180, one or more of the fingers 176 of the socket 180 are deflected radially outwardly. The deflection may include bending at their joints with the socket body 172 and/or bending along the lengths of the fingers 176. The ramped surfaces 177B of the bodies 282 and fingers 176 facilitate alignment between the components 282, 176 and deflection of the fingers 176.

According to some embodiments, the average distance of displacement or deflection of the fingers 176 is in the range of from about 0.03 mm to 0.05 mm. According to some embodiments, the finger deflection is resilient or elastic so that the fingers 176 continue to exert a persistent, radially inwardly compressive load on the post body 282. According to some embodiments, this compressive load is in the range of from about 10 N to 20 N.

In some embodiments, the module 200 is configured such that the end face 282A of each post body 282 will contact the bottom wall 172A of the receiving socket connector 170 when the module 200 is fully inserted into the receiver slot 116. In some embodiments, each post body 282 extends outwardly beyond the fingers 176 of the receiving socket connector 170 a distance in the range of from about 0 mm to 0.5 mm when the module 200 is fully inserted into the receiver slot 120.

Because the fail-safe mechanism 201 is in its ready position, the indicator member 250 is held in a retracted position (FIGS. 4, 6 and 7) by the latch fingers 242B, 244B. Additionally, when the module 200 is inserted into the receiver slot 120, the remote control pin 122 is thereby inserted into and extends through the port 218 but is depressed by the indicator strip 270 that covers the port 218. The module 200 thereby provides feedback through the depressed remote control pin 122 that the module 200 has been seated in the base 110 and the module 200 is in its ready or operational (non-failed) condition.

With the module 200 seated in the receiver slot 120, the lock member 114C is rotated into a locking position as shown in FIGS. 1 and 4.

The module 200 can be released and removed from the base 110 by executing a reverse of the foregoing procedure. The foregoing steps of mounting and removing the module 200 or other suitably configured modules in and from base 110 can be repeated multiple times. For example, in the event that the GDT 222 of the module 200 is degraded or destroyed or no longer of proper specification for the intended application, the module 200 can be replaced with a fresh or suitably constructed module.

During normal operation, the module 200 operates as an open circuit between the neutral cable 20 and the PE cable 22. The shorting bar 226 remains in a ready position (FIGS. 4 and 6) spaced apart and electrically isolated from the carrier contact members 220. In the event of a transient overvoltage or surge current in, for example, one of the lines, protection of power system load devices may necessitate providing a current path to ground for the excess current of the surge current. The surge current may generate a transient overvoltage the neutral cable 20 and the PE cable 22, which may overcome the isolation of the GDT 222. The GDT 222 will then allow the excess current to flow from the neutral cable 20, through the base terminal connector assembly 131A and the socket member 170 thereof, through the bullet connector 280A, through the first carrier contact member 220, through the GDT 222, through the opposing carrier contact member 220, through the bullet connector 280B, through the base terminal connector assembly 131B and the socket member 170 thereof, and to the protective earth cable 22.

In the event the GDT 222 is damaged (e.g., caused by a lightning current or a lightning current and a follow on current from the power source), the GDT 222 may ohmically generate heat. Absent the fail-safe mechanism 201, if the follow current were permitted to continue unabated, the GDT 222 may fail catastrophically. However, the fail-safe mechanism 201 operates as a thermal switch to bypass the GDT 222 in the event the GDT 222 overheats.

More particularly, when the heat generated by the GDT 222 exceeds a prescribed threshold, the meltable member 260 will melt (i.e., from solid to liquid or viscous). The molten meltable member 260 will be displaced or flow under the force of gravity and the load of the springs 228 on the shorting bar 226. The molten meltable member 260 may escape around the GDT 222 and/or through the openings 242E, 228B. With the meltable member 260 no longer holding the shorting bar 226 away from the GDT 222, the shorting bar 226 is forcibly displaced in a rearward closing direction C (FIG. 4) toward the GDT 222 and the shorting tabs 220E by the biasing load of the springs 228. The shorting bar 226 thereby assumes a shorting position wherein the contact end sections 226C of the shorting bar 226 are thereby pressed into contact with the shorting tabs 220E. The shorting bar 226 creates a direct short circuit between the carrier contact members 220 through the shorting bar 226. In this way, the GDT 222 is electrically bypassed between the cables 20, 22 to provide a short circuit end of life for the module 200.

The release of the shorting bar 226 as described above also actuates the local alarm mechanism 203. The trigger assembly 240 is driven in the rearward direction C (FIG. 4) along with the shorting bar 226 by the springs 228 from the lock position (FIGS. 4, 6 and 7) to a release position (FIGS. 8 and 9). The latch fingers 242B, 244B are thereby withdrawn from the latch slots 254 of the indicator member 250. Thus released, the indicator member 250 is then driven by the compressed spring 232 to slide along the rail 212B in a signaling direction S (FIG. 6). The indicator member 250 is thereby displaced to an alert position as shown in FIGS. 8 and 9 wherein the indicator surface 259 is aligned with and visible through the front window 217 of the module housing 112. The indicator surface 259 has a noticeably different visual appearance through the front window 117 than the housing indicator surface 212C, providing a visual alert so that an operator can readily determine that the local alert mechanism 203 has been activated. For example, the housing indicator surface 212C and the indicator surface 259 may have distinctly different colors (e.g., green versus red). In this manner, the local alarm mechanism 203 can provide a convenient indication that GDT 222 has failed or overheated and/or the module 200 has assumed its short circuit configuration or state.

The release of the shorting bar 226 as described above also actuates the remote alarm mechanism 205. In the ready position of the module 200, the indictor strip 270 covers the rear opening 218 so that the remote pin 122 is maintained compressed. When the meltable member 234 is melted, the ends of the legs 271, 272, 273 of the indicator strip 270 are pulled in the rearward direction C along with the trigger assembly 240 by the springs 228. The indicator strip 270 is thereby slidingly displaced, rotated or revolved through the indicator strip guide slot 212E. When the trigger assembly 240 assumes its fully released position against the GDT 222 and as shown in FIGS. 8 and 9, the indicator hole 272 will be aligned with the rear opening 218 so that the rear port 218 is no longer covered. The remote pin 122 is thereby permitted to extend further into the module 200 through the opening 218 and the indicator hole 272 to an alarm signal position. The remote pin 122 may be connected to a switch 122A or sensor in the base 110 that detects the displacement of the remote pin 122 and provides an electrical signal to a remote device or terminal. In this manner, the remote alarm mechanism 205 can provide a convenient remote indication that GDT 222 has failed or overheated and/or the module 200 has assumed its short circuit configuration or state.

The system 101 can provide a number of benefits and advantages. The construction of the connector system 103 facilitates the reliable transmission of high electrical currents (e.g., lightning surge currents) between the base 110 and the module 200. The bullets-shaped post bodies 282 and the complementary socket connectors 170 provide increased connector surface-to-surface contact. This can decrease current flow density at the connector contact interfaces and inhibit or eliminate electrical arcing.

The geometry of the connector components provide terminals that are more stiff and rigid to withstand mechanical forces induced by surge current, and also space efficient.

The closed loop, single part construction of the connector bodies 130 provides an unbroken part for surge current to flow through with maximum cross-section. The key and slot interlock between each key tab 136 and its key slot 137, as well as the relatively large radius of each bridge portion 149, can inhibit or prevent bending of the connector bodies 130 due to high current surge flow.

The closed loop, single part construction of each cage member 150 likewise provides an unbroken part for surge current to flow through with maximum cross-section. The interlocks between the key tabs 154 and key slots 158, straight tabs 156 and straight slots 160, and the flange 168 and hole 162 can inhibit or prevent bending of the cage member 150 due to high current surge flow. Moreover, these interlocks as well as the double-walled geometry of walls 152D, 152E can enable the cage member 150 to withstand higher tightening torque to secure the cables 20, 22.

During a high surge current, the surge may induce a compressive force or deflection in the fingers 176 that causes the fingers 176 to squeeze against the contact surface 282B of the corresponding post body 282 in the socket 180.

As discussed above, the socket connectors 170 are affixed to the termination portions 140 and the bullet connectors 280A, 280B are affixed to the connector mount tabs 220C by orbital riveting. This technique can provide sufficient strength to reliably secure the components during a surge.

In some embodiments, the contact surfaces of the post bodies 282 and the fingers 176 have a roughness of 0.8 μmRa or less. Such low roughness can ease coupling and decoupling of the connectors 170, 280. This low roughness can also provide greater contact surface.

In some embodiments, the module 200 is compliant with IEC 61643-11 "Additional duty test for test Class I" for SPDs (Clause 8.3.4.4) based on the impulse discharge current waveform defined in Clause 8.1.1 of IEC 61643-11, typically referred to as 10/350 microsecond ("μs") current waveform ("10/350 μs current waveform"). The 10/350 μs current waveform may characterize a current wave in which the maximum current (100%) is reached at about 10 μs and the current is 50% of the maximum at about 350 μs. Under 10/350 μs current waveform, the transferred charge, Q, and specific energy, W/R, to SPDs should be related with peak current according to one or more standards. For example, the IEC 61643-11 parameters to Class I SPD test are illustrated in Table 1, which follows:

TABLE 1

Parameters for Class I SPD Test

| $I_{imp}$ within 50 μs (kA) | Q within 5 ms (As) | W/R within 5 ms (kJ/Ω) |
|---|---|---|
| 25 | 12.5 | 156 |
| 20 | 10 | 100 |
| 12.5 | 6.25 | 39 |
| 10 | 5 | 25 |
| 5 | 2.5 | 6.25 |
| 2 | 1 | 1 |
| 1 | 0.5 | 0.25 |

In some embodiments, the module 200 is a Class I surge protective device (SPD). According to some embodiments, the DIN rail device system 101 is used in an application and electrical system as follows. The system 101 is connected between Neutral (N) and Protective Earth (PE) (N-PE) in a three phase system, using a "3+1" configuration. This means that there are three 1TE SPD S1, S2, S3 modules each connected between a respective line L1, L2, L3 and N (i.e., L-N) and one SPD module SPE connected between N and PE (i.e., N-PE), as illustrated in the electrical circuit 15 of FIG. 20. According to some embodiments, one or more of the SPD modules S1, S2, S3 SPE is a module constructed as described for the module 200 in a respective system 101 as described herein. In other embodiments, one or more of the SPD modules may be of a different construction than the SPD module as disclosed herein. For example, in some embodiments, the N-PE SPD module SPE is a module 200 in a system 101 as disclosed herein, and the L-N SPD modules S1, S2, S3 are varistor-based SPD modules. The varistor-based SPD modules may be metal-oxide varistor (MOV)-based SPD modules. The varistor-based SPD modules may be constructed as disclosed in one or more of U.S. Pat. Nos. 6,038,119, 6,430,020, 7,433,169.

Each line L1, L2, L3 may be provided with a main fuse FM and a supplemental fuse FS between the line and its SPD S1, S2, S3. A thermal disconnector K may also be provided between each line and its SPD S1, S2, S3.

In SPD modules located in a "3+1" electrical system as described, in some embodiments the N-PE SPD module must conduct the sum of lightning current (following a 10/350 μs waveform) that is conveyed on each of the four lines (three phases and neutral). So, if the current on each line is 25 kA 10/350 μs, then each SPD module connected between each line and neutral has to have a withstand capability of 25 kA 10/350 μs and the N-PE SPD module must have a withstand capability (rating) of 100 kA 10/350 μs.

It is desirable that the SPD modules have a small form factor. In particular, in some applications it is desirable that the SPD modules each have a size of 1TE according to DIN Standard 43871, published Nov. 1, 1992. According to some embodiments, the module 200 has a maximum width W9 (FIG. 1) parallel to the axis F1-F1 of about 18 mm. SPD modules configured for DIN rail mounting and designed to meet the requirements discussed above for N-PE placement typically require larger cable terminals than are provided on known 1TE sized SPD modules.

According to some embodiments, the connector system 103 (including the base connector terminal assemblies 131A, 131B and the bullet connectors 280A, 280B) can allow the conduction of a 100 kA 10/350 μs lightning current through the SPD module, without any damage on these terminals. By contrast, conventional terminals used in 1TE SPD modules may be catastrophically damaged (e.g., flashes and bending takes place in the base-to-module connectors) when a lightning current of above 50 kA goes through connectors.

Further, the thermal fail-safe mechanism 201 bypasses the GDT 222 and allows a short circuit end of life for the module 200 in case of overheating of the GDT 222. Typically, a GDT overheats when it is damaged internally during a lightning current and there is a follow current from the power source. In the case of a GDT located between N-PE, this current can be significant only in cases of power system faults (line is connected accidentally to ground). If this happens, then the GDT might fail catastrophically due to excess current conduction over a long period of time. Therefore, the fail-safe bypass mechanism 201 may be necessary to provide a safe end of life for the GDT 222.

In alternative embodiments, the shorting bar 226 is omitted or is formed of an electrically insulting material (e.g., plastic) so that when meltable member 260 is melted by overheat of the GDT 222, the alarm mechanisms 203, 205 are actuated without shorting the carrier contact members 220 around the GDT 222. In this case, the mechanism is used as a thermal indicator without interfering with the power circuit.

In some embodiments and as shown, the module 200 projects forwardly beyond the front end of the receiver slot 120 a distance in the range of from about 1 to 100 mm.

Modules including fail-safe mechanisms, alarm mechanisms and connector systems as disclosed herein may include an electrical device of a different type in place of the GDT 222. The electrical device may be an overvoltage protection device of a different type. In some embodiments, the electrical device includes a metal oxide varistor (MOV), a circuit breaker, a fuse, or a diode.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A DIN rail surge protective device (SPD) system, comprising:
- a base configured to be mounted on a DIN rail, the base defining a receiver slot;
- an SPD module configured to be removably mounted in the receiver slot, wherein, when the SPD module is mounted in the receiver slot, the SPD module and the base together form a DIN rail device mount assembly; and
- an electrical connector system to selectively electrically connect the SPD module to the base, the electrical connector system including:
  - a socket connector affixed on one of the base and the SPD module, the socket connector defining a socket; and
  - a bullet connector on the other of the base and the SPD module, the bullet connector including a post body configured to be received in the socket to electrically and mechanically connect the SPD module to the base;
- wherein the base includes a base terminal connector assembly including:
  - the socket connector;
  - a connector body, wherein the socket connector is mounted on the connector body; and
  - a cable clamp connector electrically and mechanically joined to the socket connector by the connector body;
- wherein the cable clamp connector includes:
  - a cable termination portion of the connector body;
  - a cage member; and
  - a screw operable to displace the cage member relative to the cable termination portion of the connector body to clamp a cable therebetween; and
- wherein the cable termination portion is monolithic and forms a loop defining a cavity.

2. The DIN rail SPD system of claim 1 wherein the socket and the post body are substantially cylindrical.

3. The DIN rail SPD system of claim 1 wherein:
- the socket connector includes a plurality of circumferentially distributed, radially deflectable, electrically conductive contact fingers; and
- the contact fingers define the socket.

4. The DIN rail SPD system of claim 3 wherein the socket connector includes slots between the contact fingers to permit the contact fingers to deflect independently of one another.

5. The DIN rail SPD system of claim 1 wherein the socket connector is orbital riveted to an electrically conductive terminal support.

6. The DIN rail SPD system of claim 1 wherein the bullet connector is orbital riveted to an electrically conductive terminal support.

7. The DIN rail SPD system of claim 1 wherein the bullet connector forms a part of the SPD module.

8. The DIN rail SPD system of claim 1 wherein the cable termination portion includes:
- first and second walls;
- a key slot defined in the first wall; and
- an integral key tab extending from the second wall and interlocked with the key slot to inhibit or prevent the first and second walls from separating.

9. The DIN rail SPD system of claim 1 wherein the cage member:
- is monolithic;
- forms a loop defining a cavity; and
- surrounds a portion of the cable termination portion.

10. The DIN rail SPD system of claim 9 wherein the cage member includes:
- first and second walls;
- a key slot defined in the first wall; and
- an integral key tab extending from the second wall and interlocked with the key slot to inhibit or prevent the first and second walls from separating.

11. The DIN rail SPD system of claim 9 wherein the cage member includes:
- an inner front wall;
- an outer front wall overlying the inner front wall;
- a hole defined in the outer front wall; and
- an integral, threaded flange on the inner front wall;
- wherein the flange extends into the hole and is threadedly mated with the screw.

12. The DIN rail SPD system of claim 1 wherein:
- the connector body includes:
  - a socket connector mount portion on which the socket connector is mounted; and
  - a bridge portion connecting the cable termination portion to the socket connector mount portion;
- the connector body is monolithic; and
- the bridge portion has an arcuate cross-sectional profile with an arc radius in the range of from about 5 mm to 6 mm.

13. The DIN rail SPD system of claim 1 wherein the SPD module includes:
- a module housing; and
- a gas discharge tube (GDT) mounted in the module housing.

14. The DIN rail SPD system of claim 1 wherein the SPD module includes:

a module housing; and a fail-safe mechanism mounted in the module housing, wherein the fail-safe mechanism is operative to form an electrical short circuit through the SPD module in response to a prescribed temperature.

* * * * *